US011674722B2

(12) United States Patent
Nicewonger

(10) Patent No.: US 11,674,722 B2
(45) Date of Patent: Jun. 13, 2023

(54) APPARATUS FOR DELIVERY AND RETRACTION OF FLUIDS

(71) Applicant: Proteus Industries Inc., Mountain View, CA (US)

(72) Inventor: Mark R Nicewonger, Mountain View, CA (US)

(73) Assignee: Proteus Industries Inc., Mountain View, CA (US)

(*) Notice: Subject to any disclaimer, the term of this patent is extended or adjusted under 35 U.S.C. 154(b) by 0 days.

(21) Appl. No.: 17/326,318

(22) Filed: May 20, 2021

(65) Prior Publication Data

US 2021/0364199 A1 Nov. 25, 2021

Related U.S. Application Data

(60) Provisional application No. 63/027,896, filed on May 20, 2020.

(51) Int. Cl.
*F25B 41/20* (2021.01)
*H05K 7/20* (2006.01)

(52) U.S. Cl.
CPC .......... *F25B 41/20* (2021.01); *H05K 7/20281* (2013.01)

(58) Field of Classification Search
CPC ................................................. H05K 7/20281
See application file for complete search history.

(56) References Cited

U.S. PATENT DOCUMENTS

| 3,371,500 | A | * | 3/1968 | Marcus, Jr. ............. | F25B 41/20 62/117 |
| 4,482,008 | A | * | 11/1984 | Nomaguchi et al. ... | F25B 41/20 165/240 |
| 7,299,645 | B2 | * | 11/2007 | Oshitani ................. | F25B 41/00 62/191 |
| 9,010,141 | B2 | * | 4/2015 | Harrington ............... | F28F 7/02 62/259.2 |
| 10,022,815 | B2 | * | 7/2018 | Nicewonger ........... | F04B 53/14 |
| 10,641,406 | B2 | | 5/2020 | Rosaen et al. | |
| 11,555,638 | B2 | | 1/2023 | Rosaen et al. | |

OTHER PUBLICATIONS

International Search Report ("ISR") from ISA/US for PCT/US2021/033516, ISR dated Aug. 16, 2021, 2 pages.
International Written Opinion ("WO") from ISA/US for PCT/US2021/033516, WO dated Aug. 16, 2021, 6 pages.

* cited by examiner

*Primary Examiner* — Eric Keasel
(74) *Attorney, Agent, or Firm* — Francis Law Group

(57) ABSTRACT

System, method, and apparatus for controlling circulation of fluid to, and evacuation of the fluid from, an external fluid circuit for heat transfer. A single control valve selectively stops the circulation of fluid from a supply passageway to an external fluid circuit, and diverts fluid to a bypass passageway which creates a suction force at a fluid restriction therein. A suction passageway couples the suction force of bypass passageway to either return passageway or supply passageway, for evacuating fluid from external fluid circuit. No other valve is disposed or required in the supply passageway or the bypass passageway apart from the single control valve. No more than a single actuator is required to operate the apparatus. No more than a single suction passageway is required to be coupled to either supply passageway and/or return passageway. A return check valve disposed in return passageway prevents backflow of fluid through return passageway.

20 Claims, 23 Drawing Sheets

APPARATUS FOR DELIVERY AND RETRACTION OF FLUIDS

CROSS-REFERENCE TO RELATED APPLICATIONS

This application claims priority to U.S. provisional application: Ser. No. 63/027,896 filed May 20, 2020, titled "METHOD AND APPARATUS FOR CONTROLLING CIRCULATION OF LIQUID COOLANT", the disclosures of said application is incorporated by reference herein in its entirety.

Furthermore, where a definition or use of a term in a reference, which is incorporated by reference herein, is inconsistent or contrary to the definition of that term provided herein, the definition of that term provided herein applies and the definition of that term in the reference does not apply.

FIELD OF TECHNOLOGY

The present invention(s) relate generally to heat exchanger systems. More particularly, the invention(s) relate to systems and methods to circulate and to evacuate fluid from a heat exchanger system.

BACKGROUND

Resistance welding, i.e., spot welding, machines require cooling heat-exchanger systems, typically employing a liquid coolant, to maintain the copper welding electrodes below a maximum temperature. These cooling heat-exchanger systems largely prevent the electrodes from deforming due to excess heat, where such deformation may lead to poor quality in the welded joint and possible fusing of the electrode to the sheet metal being spot-welded. Typically, circulating water-coolant systems are used to cool the spot welding machine electrodes.

The electrodes are designed to be periodically replaced for scheduled preventative maintenance, poor performance, or a failure. The base end of the electrode accommodates an internal circulation of the coolant, typically water, to remove heat. The circulation of water can be blocked on a supply side to the electrode, and on a return side from the electrode, thereby creating an isolated section of the flow path. This isolated section would ideally have zero fluid pressure, thereby accommodating removal of the electrode. However, residual pressurized water can remain in the isolated section, and escape from the gap created in the flow path when the electrode is removed. This undesired water spillage may create hazards for the welding equipment and operations personnel.

Although past systems may reduce spillage to some degree by simply shutting off water flow at the source when a welding electrode is removed, this is not optimal because spillage can still occur from the residual water in the coolant system. Past system designs have sought to stop or minimize spillage by utilizing mechanical devices, such as a piston in a cylinder, to generate a suction force to pull water back from a coolant line where electrodes are planned to be removed. However, the effectiveness of such systems is limited by the fixed stroke of the piston, and therefore limited suction potential. Such systems are also subject to maintenance issues because of water contacting the piston and cylinder.

Some non-mechanical system designs do not require moving parts, like a piston, to accomplish the evacuation. These non-mechanical systems eliminate the shortcomings of a piston and cylinder through the use of multiple valves, one in each of multiple fluid lines, slated for either normal cooling operation, or for drawing suction to evacuate fluid from the electrode coolant line.

SUMMARY

An apparatus controls the circulation of a fluid, such as a liquid coolant or a liquid heating fluid, from a supply passageway to, and an evacuation of the fluid from, an external fluid circuit that typically includes a device to be cooled or heated. Said device is coupled to the apparatus by coolant lines of the external fluid circuit. The apparatus includes a three-way implementation of a multi-way valve, aka a control valve, to selectively stop the circulation flow of the liquid, e.g., a coolant fluid or a heating fluid, to the device via the external fluid circuit, while simultaneously diverting the liquid coolant through a bypass passageway coupling the supply passageway to a return passageway. In another embodiment, a third position of the multi-way valve is an 'all closed' position to cease all fluid flow to all passages. In a preferred embodiment, no other valve is disposed in the supply passageway or the bypass passageway apart from the control valve. Stated differently, in one embodiment no more than a single control valve and a single check valve are required in the apparatus for the apparatus to control the circulation of the fluid to, and an evacuation of the fluid from, the external fluid circuit. No valves of any type are required in the bypass passageway in any embodiment.

By simultaneously i) stopping fluid from flowing to the external circuit, and ii) diverting the fluid to the bypass passageway, with no more than a single valve being required and no more than a single actuator tied to the single valve being required, benefits ensue. Specifically, benefits of the present disclosure include minimized or reduced: part count, system cost, quantity of programming code/bugs, leak joints, operator training, and quantity and severity of failure modes such as discrete valve failures or timing faults. In addition, the present embodiment is guaranteed to perform both operations (stopping and diverting) simultaneously and consistently for a given actuation, since the hardware is a single physical item, i.e., a single ball valve with physical channels. Barring a catastrophic failure of the entire valve, successful fluid operations described above for a given actuation are nearly identical, all things considered.

In comparison, conventional solutions utilizing multiple individual valves are subject to failure of an individual valve. Furthermore, individual valve operations may be sequenced and timed, which could lead to timing or misoperation failures with one or more of the multiple valves. One exemplary failure mode and effect analysis (FMEA) of a conventional architecture using separate valve include a failure of an accidental or premature opening of a separate bypass valve while a separate main supply remains open in a standard cooling configuration to the external fluid circuit. This short circuits the cooling path to the return line, thereby starving a fluid flow to a device to be cooled, and likely resulting in early failure of said device. Another FMEA of the conventional architecture using separate valves is a failure to open a separate bypass valve after a separate main supply is closed, which could lead to a non-evacuated external fluid line with subsequent spillage and a resultant safety hazard, equipment damage, and lost productivity.

The present disclosure overcomes the limitations of the conventional solutions. The bypass passageway creates a suction force from a sufficient circulation flow of the liquid coolant through a fluid restriction disposed in the bypass passageway. The bypass passageway has a fluid restriction, aka a constricted or a choke portion of a pipe. Specifically, at least one section of the bypass passageway has at least one fluid restriction coupled to a gradually changing cross-sectional area on either side, i.e., upstream and downstream, of the fluid restriction.

The present embodiment also includes a suction passageway for evacuating at least a portion of the fluid from the external fluid circuit (the coolant lines). The suction passageway is coupled to the bypass passageway, which created the suction force. The suction passageway is also coupled to at least one of the return passageway or the supply passageway, No more than a single suction passageway is required to be coupled to at least one of the supply passageway or the return passageway in order to evacuate at least a portion of, or a sufficient quantity of, or all of the fluid from the external fluid circuit (and optionally in the cooled device disposed in the external fluid circuit) in order to prevent leakage from the external fluid circuit, in one embodiment. This prevents liquid from escaping in an external fluid circuit when the cooled device is detached from the coolant lines, or if a coolant line is intentionally or accidentally disconnected or broken. Another embodiment couples a suction passageway to both the supply passageway and the return passageway.

In yet another embodiment, an optional suction check valve is disposed in the suction passageway to prevent a backflow of the fluid from the bypass passageway to the external fluid circuit via said suction passageway and the return passageway when the apparatus is in a bypass mode for evacuating fluid from the external fluid circuit. For an embodiment with a sufficiently high flow rate through the bypass passageway when the apparatus is in bypass mode (for evacuation), no suction check valve is required in the suction passageway. The sufficiency of the flow rate is one that generates a suction force in the bypass passageway strong enough to prevent a backflow of fluid from the bypass passageway through the suction passageway and into the return passageway.

The apparatus includes a second shutoff valve in an optional suction passageway coupled to the supply passageway, in one embodiment. The second shutoff valve prevents an incidental flow of the liquid coolant from the supply passageway (downstream of the control valve) through the optional suction passageway to the bypass passageway then finally into the return passageway. The second shutoff valve is used in a standard operation of supplying fluid to the external fluid circuit to a device that utilizes the fluid, e.g., to be cooled or heated.

A return check valve is disposed in the return passageway to prevent a backflow of fluid in the return passageway back into the external fluid circuit, when the apparatus is in a bypass/evacuation mode. In this configuration, liquid coolant from the supply passageway is diverted away from the external fluid circuit into the bypass passageway. In this diverted flow mode, liquid coolant is evacuated from the supply passageway (downstream from the control valve) and/or from the return passageway (upstream from the return check valve).

The apparatus may also include a single actuator to operate both the supply passageway valve and an optional suction passageway valve. While no more than a single actuator is required to operate the apparatus, e.g., a single control valve or a combination of the control valve and the suction shutoff valve tied together, another embodiment can utilize more than one actuator. In certain embodiments, a motion of at least a portion of a robot, e.g., a robot arm, can actuate a valve handle of any or all valves.

Another embodiment utilizes a vent passageway that couples a supply passageway to atmospheric pressure, and utilizes a vent check valve disposed in the vent passageway. The vent check valve prevents leakage of fluid outside the fluid circuit.

The present apparatus is useful in a system with any type of device or apparatus that utilizes a fluid flow for a function such as cooling, e.g., spot welding tips, or heating, e.g., high-temperature plating, or other manufacturing processing, e.g., chemical vapor deposition. The present apparatus is more useful in a system requiring evacuation of fluids for purposes of safety, cost, or convenience. Examples include gas or liquids that are toxic or that create safety hazards when spilled. Another application in which the present apparatus is useful is equipment requiring frequent preventative maintenance (PM) of fluid circuits, or fluid circuits requiring substitution of fluid types, or critical equipment sensitive to leaks from an accidental break in the external fluid circuit. Exemplary device applications include a resistance (spot) welding system, a semiconductor device, an electronic circuit, a semiconductor fabrication equipment, etc.

The operation of the present disclosure provides a single actuation of a valve to control a circulation of a fluid to, and an evacuation of the fluid from, an external fluid circuit. Applications with an external fluid having a return passageway are ideal for evacuation. For applications with a supply passageway and no need for a return passageway (applications that consume the fluid), the bypass passageway may be coupled back to the fluid source instead of to a return passageway, and the suction passageway coupled to the supply passageway to evacuate any remaining fluid in the supply passageway downstream of a shutoff valve.

Operation of the present apparatus and system starts by supplying fluid via a supply passageway to an external fluid circuit having a device that utilizes the fluid (for heat transfer, chemical processing, etc.). Thereafter, the fluid is returned typically to a reservoir via a return passageway coupled downstream of the device utilizing the fluid flow. The supply passageway includes a control valve for regulating flow of the fluid.

If an accidental break or rupture of a portion of the external fluid circuit occurs, then an actuation of no more than a single control valve is required to remedy the situation. Actuation of the single control valve effectively i) shuts down a main fluid flow in the supply passageway to the external fluid circuit and ii) simultaneously evacuates fluid in the external fluid line, thereby preventing leakage and maintaining safety. In a crisis event, simplicity, reliability, and robustness of a system and its response to failure modes is extremely important for mitigating damage and preventing catastrophic events. The present embodiment requires not more than a single actuator to operate the single control valve for shutting down fluid flow and evacuating fluid from the external fluid circuit.

The same single actuation of the valve is convenient for preventative maintenance (PM) on the external fluid circuit. After actuating the single valve, the external fluid circuit is automatically evacuated without any other action being required. When pressure in the external fluid circuit drops to ambient pressure or lower, the external fluid circuit will not spurt or leak when opened or separated for the PM work.

The evacuation operation begins by diverting fluid from the supply passageway intended for the external fluid circuit to the bypass passageway for an evacuation. A suction force is created in the bypass passageway when the fluid flows through a fluid restriction with a gradually decreasing cross-sectional area on an upstream side of the fluid restriction and with a gradually increasing cross-sectional area on a downstream side of the fluid restriction.

The suction force from the bypass passageway is communicated to the external fluid circuit via at least one of a suction passageway to the supply passageway and/or a suction passageway to the return passageway, for which no more than one is required. Regardless of whether the supply passageway or the return passageway is utilized, the present embodiment successfully evacuates at least a portion of, or at best all of, the fluid from the external fluid circuit such that no leakage occurs in the external passageway. When the apparatus is in a diverted flow mode (for evacuation), if a sufficient flow rate exists through the bypass passageway, then no suction check valve is required in the suction passageway.

In another embodiment, the suction force generated by the bypass passageway is communicated to both the supply passageway and the return passageway. This embodiment provides a more robust evacuation of fluid in the external fluid circuit for certain applications. An optional shutoff valve in the suction pathway disposed between the supply passageway and the bypass passageway is closed during normal apparatus operation when communicating fluid to the external fluid circuit, e.g., for cooling a device. The optional shutoff valve is only opened when the apparatus is in an evacuation mode where the fluid is diverted through the bypass passageway.

In an application with a single external fluid circuit (no parallel passageways therein), an optional parallel suction passageway (short circuit) can be used for more effective evacuation of fluid from the external fluid circuit. The optional parallel suction passageway of the apparatus couples a supply passageway downstream of the control valve to the return passageway upstream of the return check valve to ensure complete evacuation of fluid from said external fluid circuit. Such an embodiment may include an optional shutoff valve in the parallel passageway to stop a flow of liquid through the parallel passageway when liquid is being supplied to the external fluid circuit.

Backflow from a pressurized return passageway is prevented from leaking back to the external fluid circuit, when the apparatus is switched to an evacuation mode, by a return check valve. The return check valve is disposed in the apparatus between a junction of the bypass passageway/return passageway and the external fluid circuit.

The present disclosure contemplates additional components or operations beyond that required for a given embodiment in the disclosure, when said additional component or operation is utilized for redundancy, for robustness, or for a split of function of the given embodiment.

The methods, operations, processes, systems, and apparatuses disclosed herein may be implemented in any means for achieving various aspects, and may be executed in a form of a machine-readable medium, and/or a machine accessible medium, embodying a set of instructions that, when executed by a machine or a data processing system (e.g., a computer system), in one or more different sequences, cause the machine to perform any of the operations disclosed herein. Other features will be apparent from the accompanying drawings and from the detailed description that follows. Accordingly, the specification and drawings are to be regarded in an illustrative rather than a restrictive sense.

This Summary is provided to introduce a selection of concepts in a simplified form that are further described below in the Detailed Description. This Summary is not intended to identify key or essential features of the claimed subject matter, nor is it intended to be used as an aid in determining the scope of the claimed subject matter.

BRIEF DESCRIPTION OF THE VIEW OF DRAWINGS

Example embodiments are described by way of illustrations and are not limited by the figures of the accompanying drawings, wherein.

Figure 1:
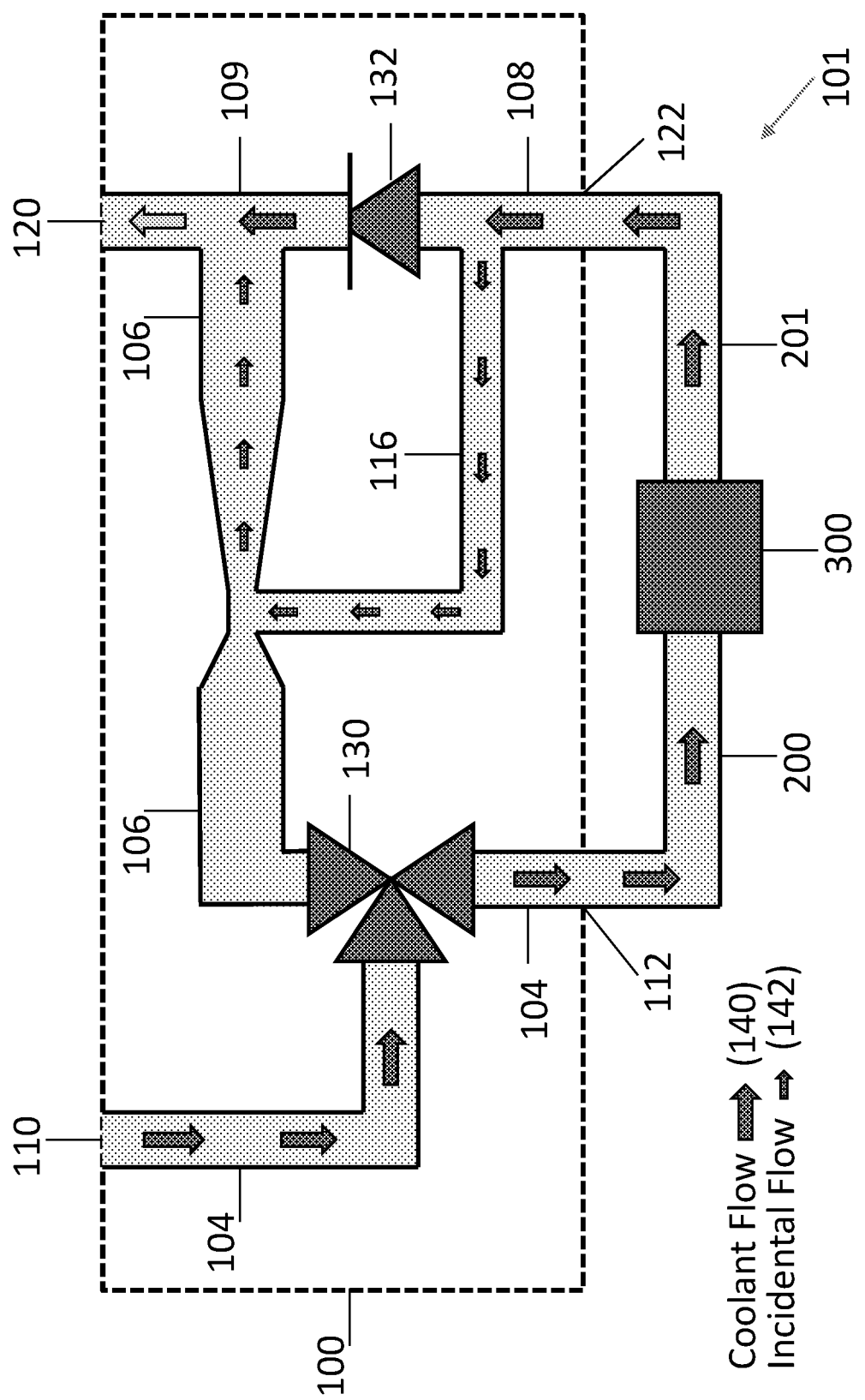
FIG. 1 is a schematic of an apparatus with a single control valve in the supply passageway, no valve in a bypass line, and a check valve in a return passageway for delivering a liquid coolant flow to a cooled device in an external passageway, according to one or more embodiments.

The drawings referred to in this description should be understood as not being drawn to scale, except if specifically noted, in order to show more clearly the details of the present disclosure. Same reference numbers in the drawings indicate like elements throughout the several views. Other features and advantages of the present disclosure will be apparent from accompanying drawings and from the detailed description that follows.

DETAILED DESCRIPTION

List of Reference Designators

| 100 | apparatus |
|---|---|
| 101 | external fluid circuit |
| 104 | supply passageway |
| 106 | bypass passageway |
| 108 | return passageway |
| 109 | exhaust passageway |
| 110 | source inlet |
| 111 | vent passageway |
| 112 | supply outlet |
| 113 | vent inlet |
| 115 | parallel suction passageway |
| 116 | suction passageway |
| 117 | return suction check valve |
| 120 | exhaust outlet |
| 122 | return inlet |
| 124 | shutoff valve |
| 126 | valve actuator |
| 127 | actuator handle |
| 128 | vent check valve |
| 130 | three-way valve |
| 131 | valve diaphragm |
| 132 | return check valve |
| 133 | gradually decreasing cross-sectional area |
| 134 | fluid restriction |
| 135 | gradually increasing cross-sectional area |
| 136 | low-pressure zone |
| 138 | atmospheric pressure |
| 140 | coolant flow |
| 142 | suction flow |
| 144 | incidental flow |
| 146 | air flow |
| 150 | detachment |
| 200 | first supply line |
| 201 | first return line |
| 202 | second supply line |
| 203 | second return line |
| 204 | upstream opening |
| 206 | downstream opening |
| 300 | first cooled device |
| 302 | second cooled device |
| 304 | first connection |
| 306 | second connection |
| 400 | robot arm |
| 402 | welding apparatus |
| 404 | handle stop |
| 406 | pedestal |
| 410 | robotic motion |

An apparatus 100, as shown in FIG. 1, controls a liquid coolant flow 140 to a cooled device 300. The liquid coolant enters the apparatus at a source inlet 110, and flows through a supply passageway 104 to a three-way valve 130, which selectively blocks the flow of the coolant from entering a bypass passageway 106, and allows the coolant to flow through a supply passageway 104, to exit the apparatus at a supply outlet 112. After passing through a first supply line 200 to a first cooled device 300, the coolant passes through a first return line 201 and reenters the apparatus at a return inlet 122, and flows through a return passageway 108, return check valve 132, and exhaust passageway 109 before finally being discharged from the apparatus 100 at an exhaust outlet 120. An incidental flow 142 of coolant may pass through a suction passageway 116 and the bypass passageway 106.

Figure 2A:
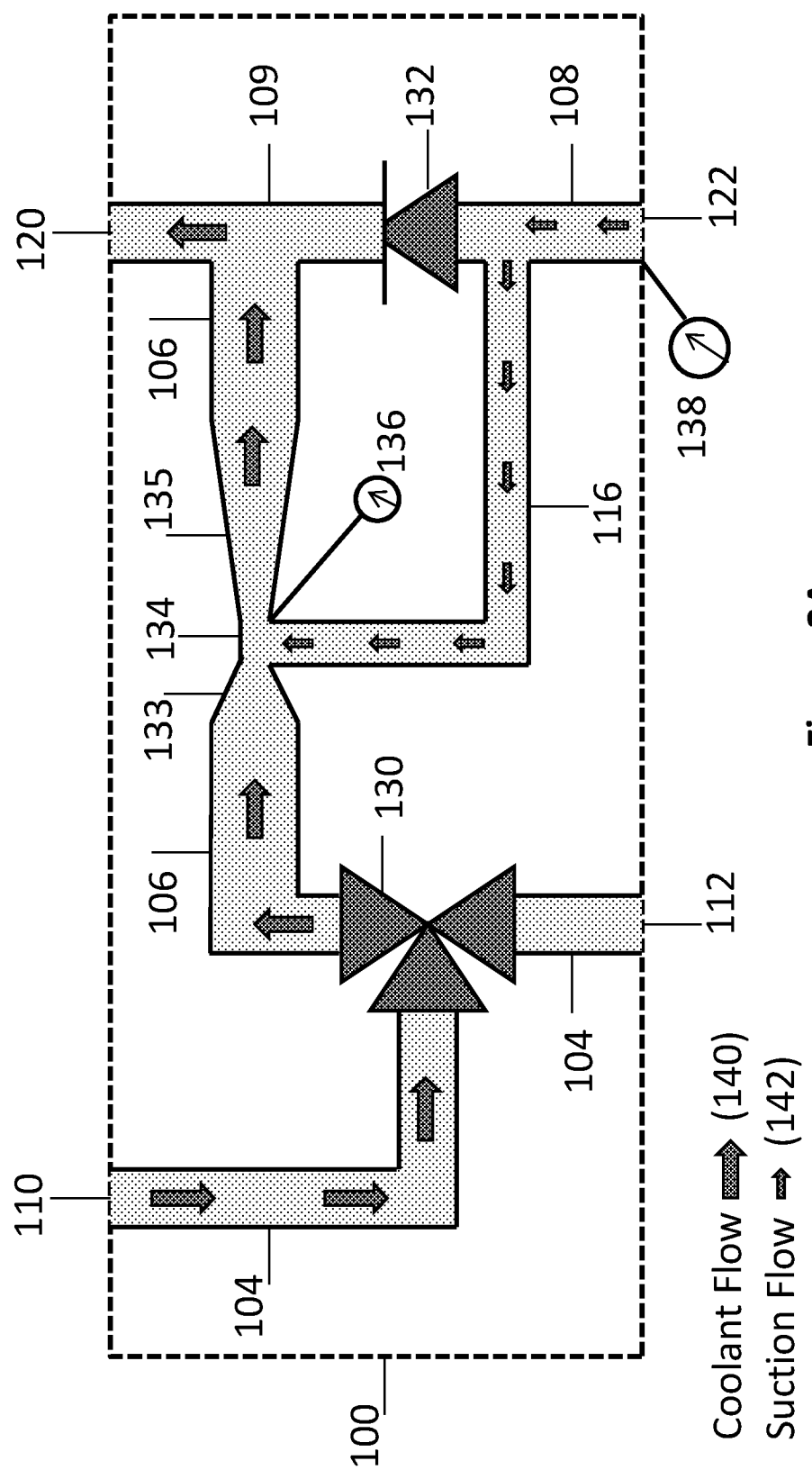
FIG. 2A is a schematic of an apparatus configured to divert liquid coolant flow away from a cooled device through a bypass passageway having a fluid restriction resulting in a suction flow of liquid coolant from a return passageway via a suction passageway, according to one or more embodiments.

As shown in FIG. 2A, the three-way valve 130 may selectively shut off the flow of the coolant to the supply outlet 104, and divert the coolant flow 140 through the bypass passageway 106, and thence to the exhaust passageway 109, where the coolant exits the apparatus 100 through the exhaust outlet 120. The return check valve 132 prevents a backflow of the coolant from the exhaust passageway 109 to the return passageway 108 and return inlet 122. The bypass passageway includes section having a gradually decreasing cross-sectional area 133 a fluid restriction 134, and a section having a gradually increasing cross-sectional area 135, whereby a sufficient flow of the coolant through the fluid restriction 134 creates a low-pressure zone 136, having a pressure of the liquid coolant that is less than an atmospheric pressure 138 surrounding the apparatus 100.

As further shown in FIG. 2A, suction passageway 116 is coupled from the fluid restriction 134 to the return passageway 108. If the return coolant inlet 122 is open to the atmospheric pressure 138 while sufficient liquid coolant flow 140 is passing through the fluid restriction 134, the pressure difference between the low-pressure zone 136 and the atmospheric pressure 138 may cause a suction flow 142 of a portion of the liquid coolant that may be contained in the return passageway 108 to be drawn through the suction passageway 116, and added to the liquid coolant flow 140 through the bypass passageway 106 to be discharged from the apparatus 100 through the exhaust passageway 109 and exhaust outlet 120.

Figure 2B:
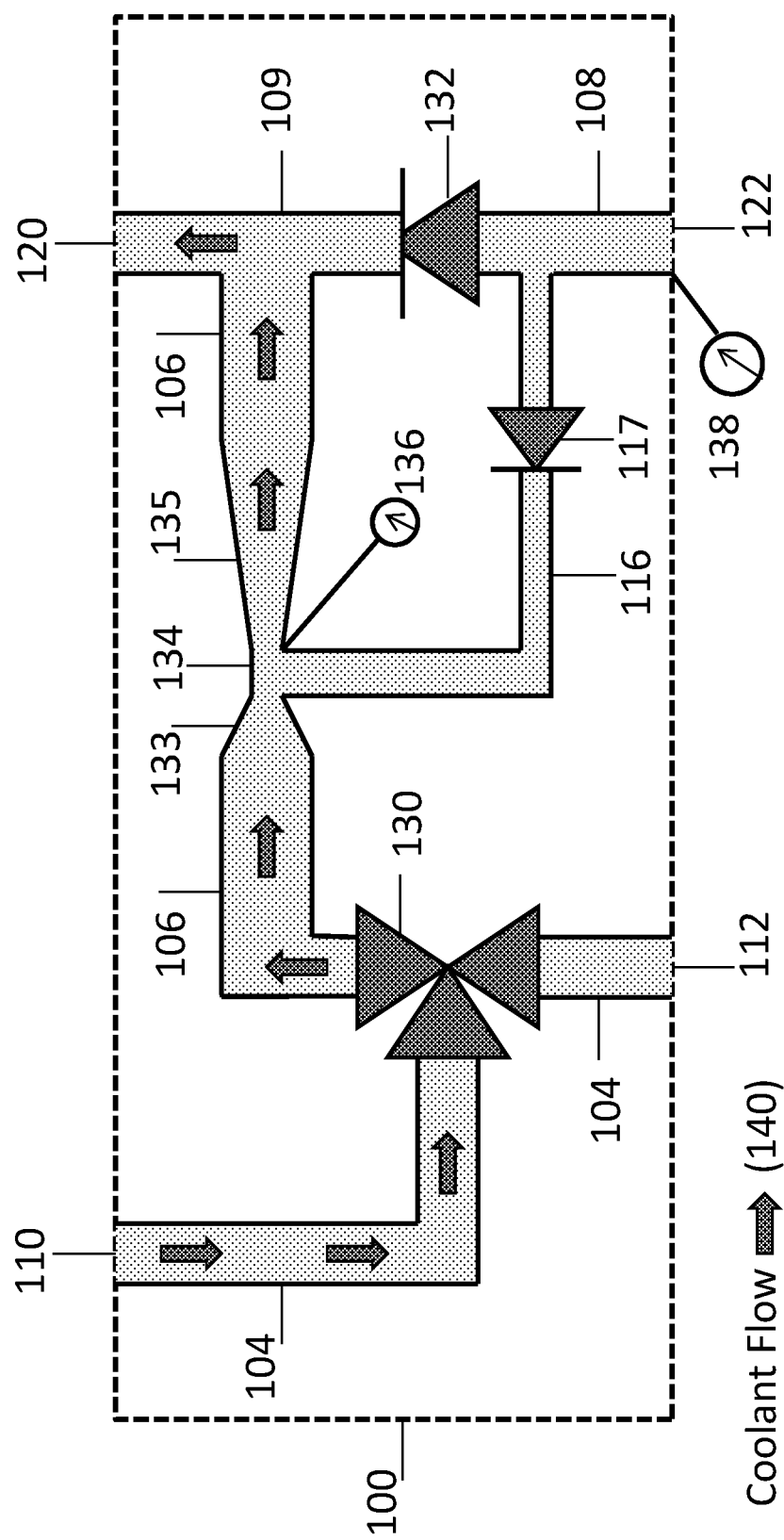
FIG. 2B is a schematic of an apparatus with a suction check valve in the suction passageway to prevent the coolant flow from passing through the suction passageway, according to one or more embodiments.
Figure 2C:
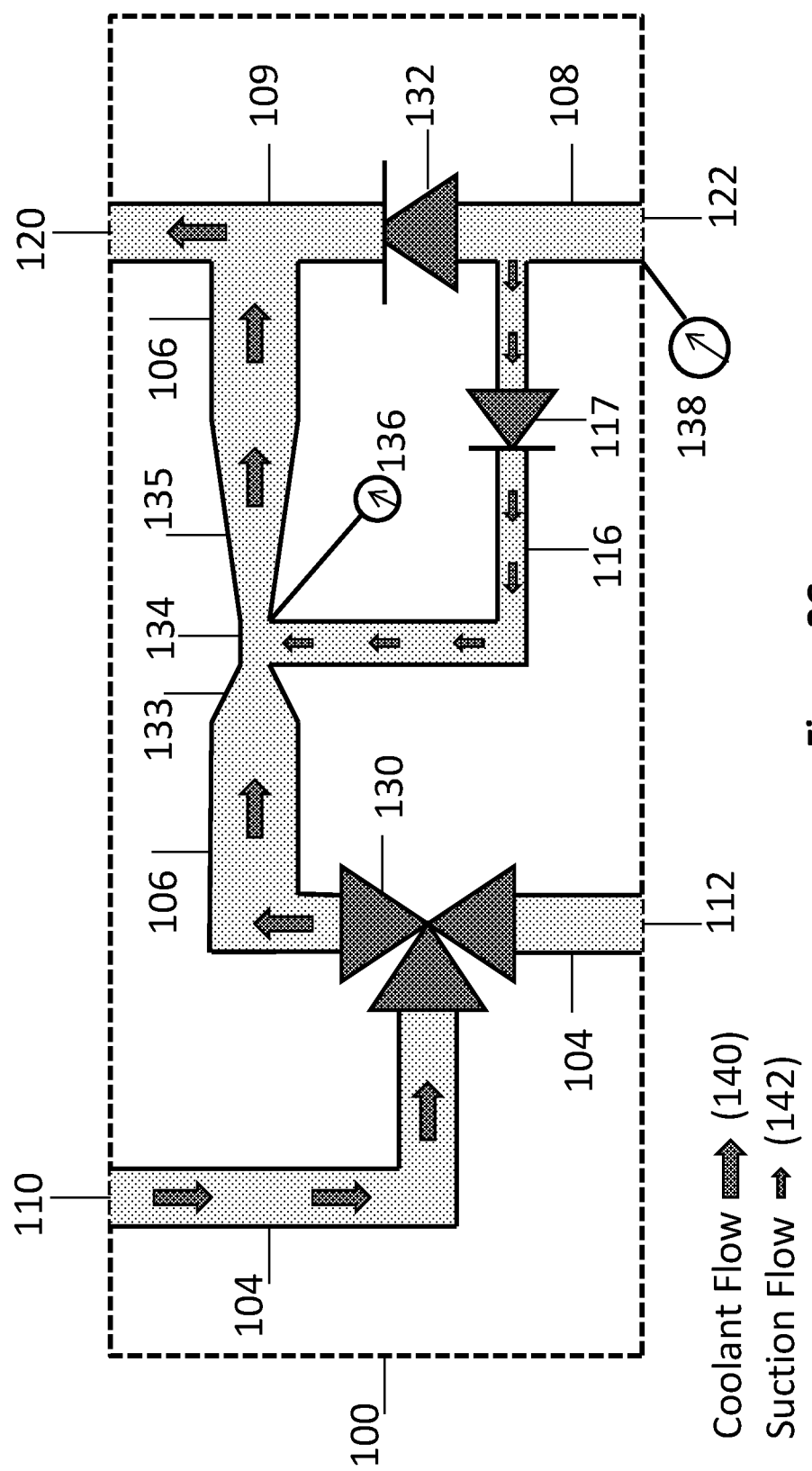
FIG. 2C is a schematic of an apparatus with a suction check valve that allows a suction flow to pass through the suction passageway, according to one or more embodiments.

A return suction check valve 117, as shown in FIG. 2B, may be disposed in the suction passageway 116 to prevent an unintended portion of the liquid coolant flow 140 from escaping through the suction passageway 116 and return passageway 108 when the return inlet 122 is open to the atmospheric pressure 138 and the liquid coolant flow 140 through the fluid restriction 134 is insufficient to create a low pressure zone 136. However, the return suction check valve 117 will allow a suction flow 142 of a portion of the liquid coolant that may be contained in the return passageway 108 to be drawn through the suction passageway 116 when the liquid coolant flow 140 passing through the fluid restriction 134, is sufficient to create a low pressure zone 136, while the return inlet 122 is open to the atmospheric pressure 138, as shown in FIG. 2C.

Figure 3:
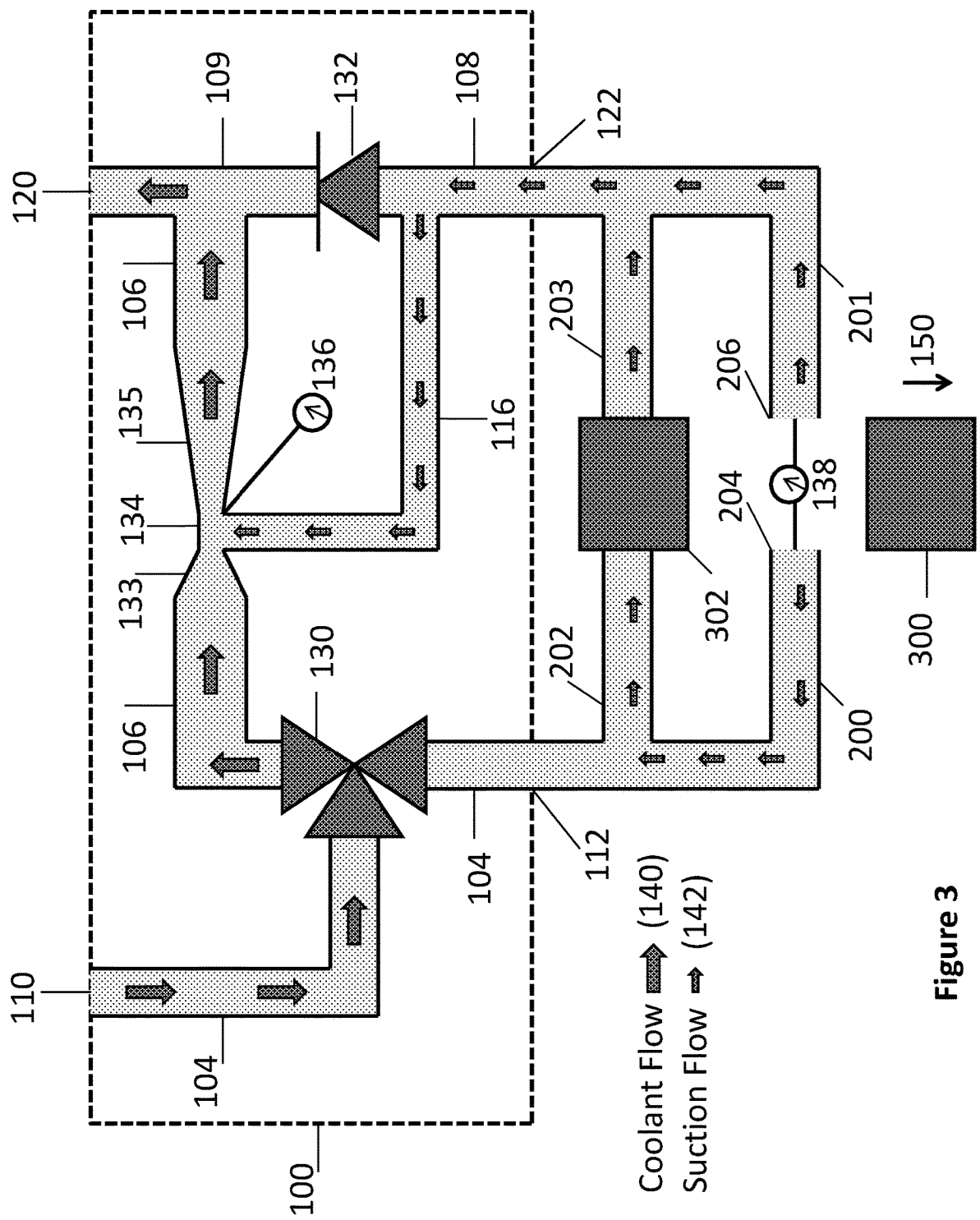
FIG. 3 is a schematic of an apparatus with a suction flow of liquid coolant through a suction passageway, when a first cooled device is detached and when a parallely-coupled second cooled device remains coupled, according to one or more embodiments.

FIG. 3 illustrates two cooled devices, shown in this example as a first cooled device 300 disposed between the first supply line 200 and the first return line 201, and a second cooled device 302 disposed between a second supply line 202 and a second return line 203, with both sets of cooled devices and coolant lines coupled in parallel between the supply coolant outlet 112 and return coolant inlet 122. One or more openings, e.g., an upstream opening 204 in the first supply line 200, and a downstream opening 206 in the first return line 201, created in this example by the detachment 150 of the first cooled device 300 from the first supply line 200 and the first return line 201, or alternately created by a break in the first supply line 200 or the second supply line 201, may occur without a significant leakage of the liquid coolant that may be contained in the first supply line 200 or the first return line 201. The pressure difference between the low-pressure zone 136 and the atmospheric pressure 138 may allow the suction flow 142 of a portion of the liquid coolant that may be contained in the first return line 201 to be drawn away from the downstream opening 206, while the second return line 203, the second cooled device 302 and the second supply line 202 provide a fluid coupling to the low-pressure zone 138 that may allow the suction flow 142 of a portion of the liquid coolant that may be contained in the first supply line 200 to be drawn away from the upstream opening 204.

Figure 4:
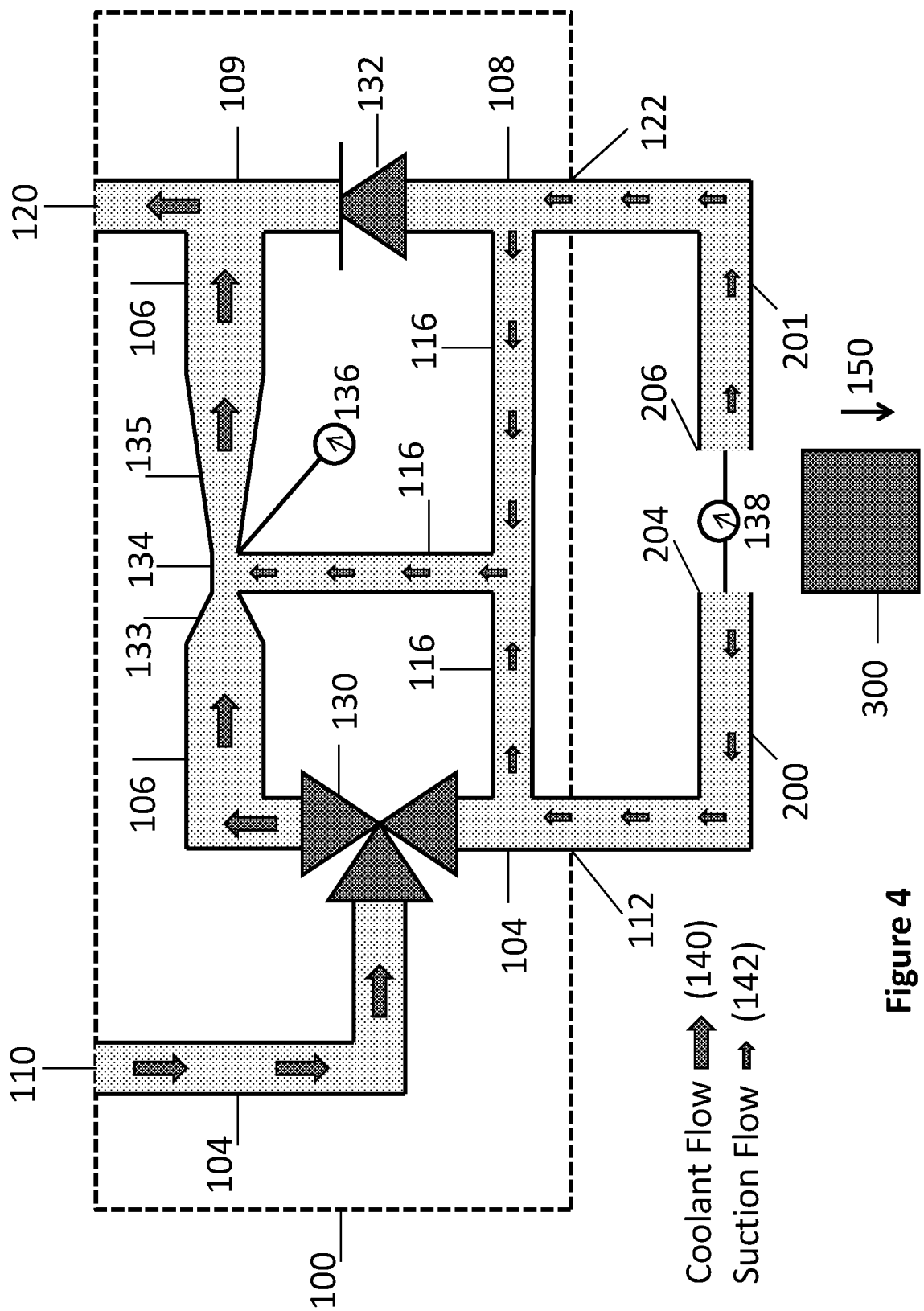
FIG. 4 is a schematic of an apparatus with a suction flow path of liquid coolant through a suction passageway from both a supply passageway and a return passageway, according to one or more embodiments.
Figure 5:
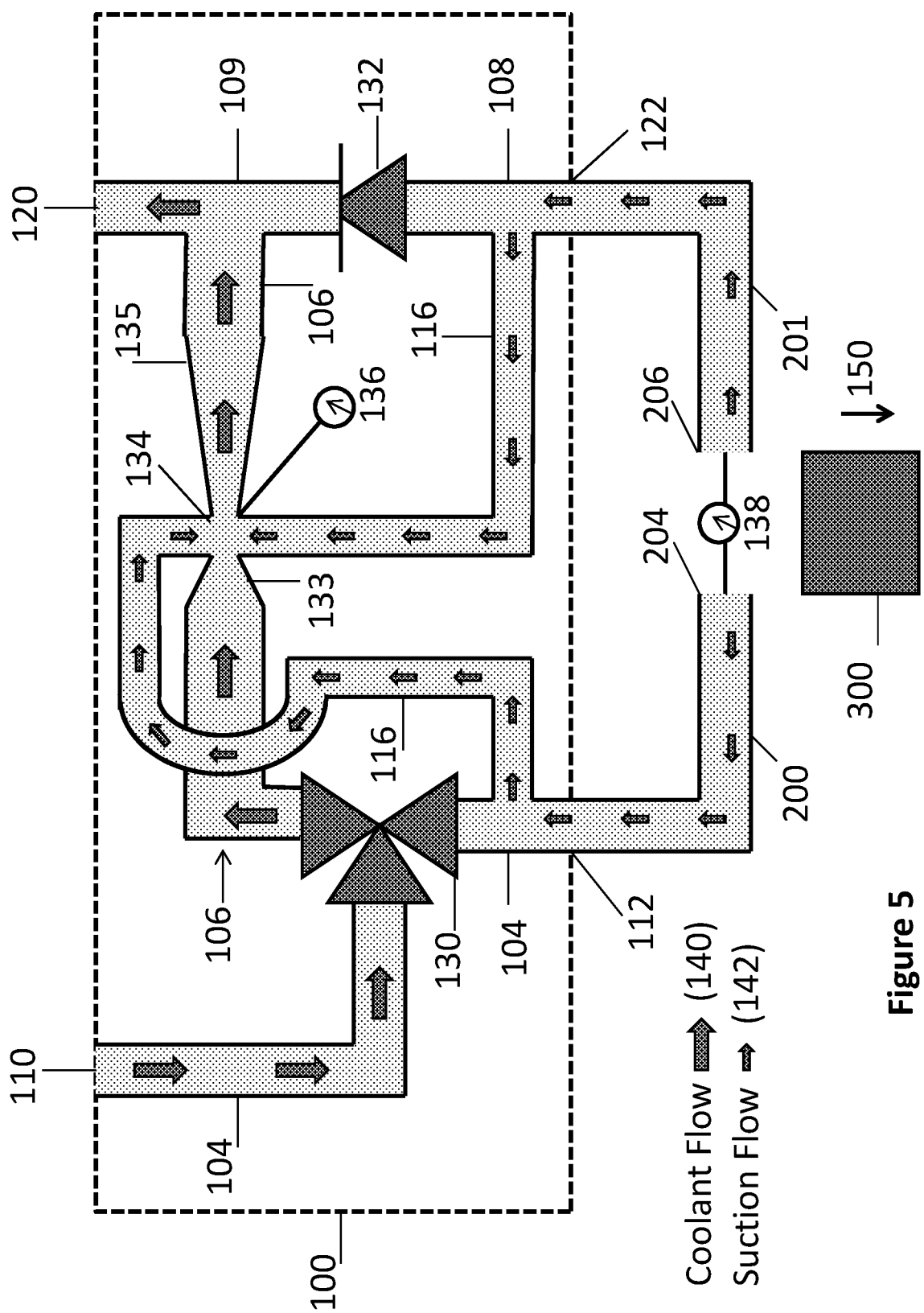
FIG. 5 is a schematic of an apparatus with a suction flow of liquid coolant through two individual suction passageways respectively coupled to a supply passageway and a return passageway, according to one or more embodiments.
Figure 6:
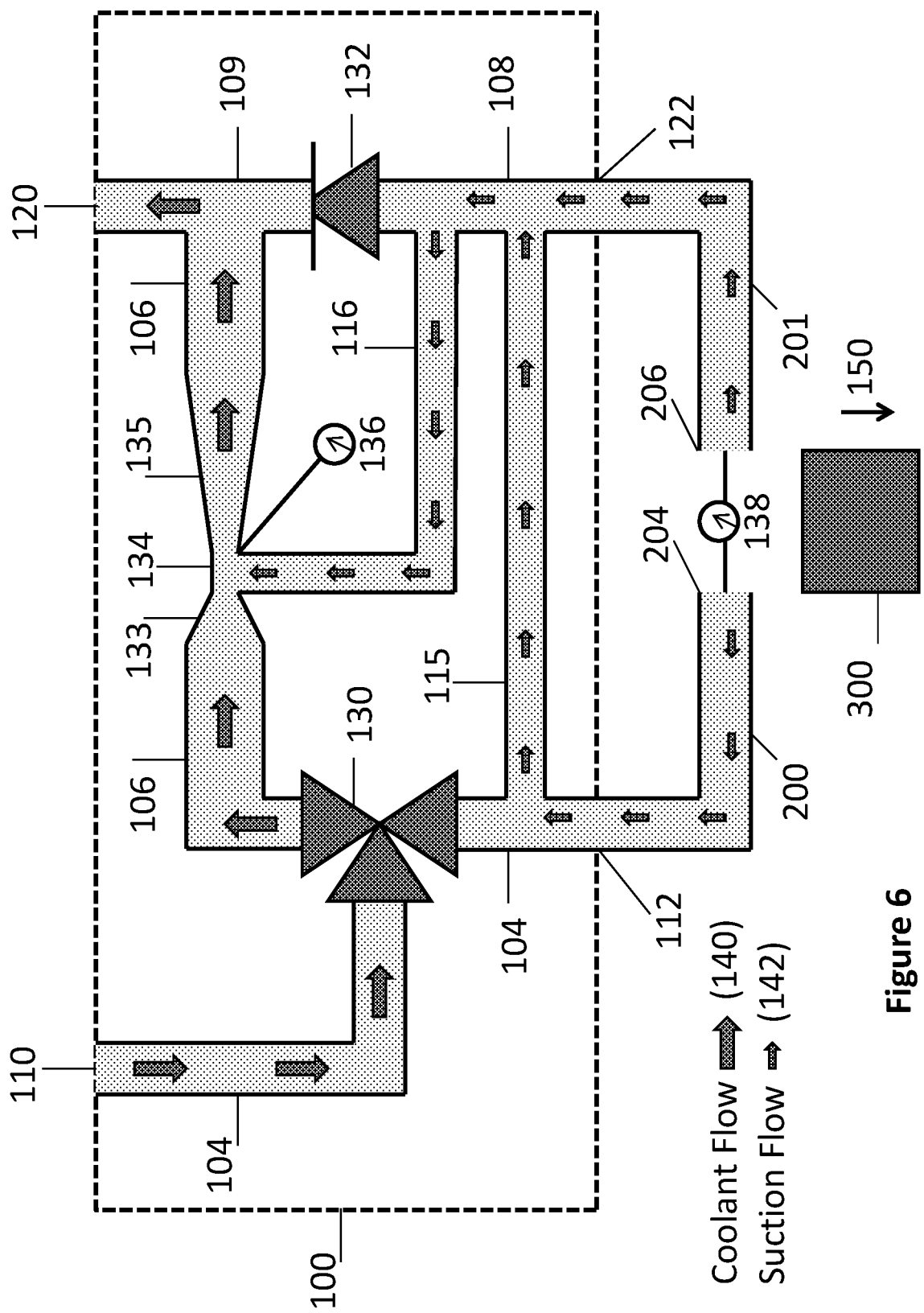
FIG. 6 is a schematic of an apparatus with a suction flow path of liquid coolant through a parallel suction passageway coupling a supply passageway to a return passageway, according to one or more embodiments.

As shown in FIG. 4, when the apparatus 100 delivers the liquid coolant flow 140 to only the first cooled device 300, or to multiple cooled devices serially disposed between the first supply line 200 and the first return coolant line 201, the suction passageway 116 may provide a common connection to both the supply passageway 104 or return passageway 108 to allow for a suction flow 142 from either the upstream opening 204 in the first supply line 200, or the downstream opening 206 in the first return line 201. Alternately, the suction passageway 116 may provide separate connections to the supply passageway 104 and return passageway 108 as illustrated in FIG. 5. And as shown in FIG. 6, a third method of coupling the low-pressure zone 136 to the upstream opening 204 would be to include a parallel passageway 115 within the apparatus 100 to provide a fluid coupling between the supply passageway 104 and the return passageway 108.

Figure 7:
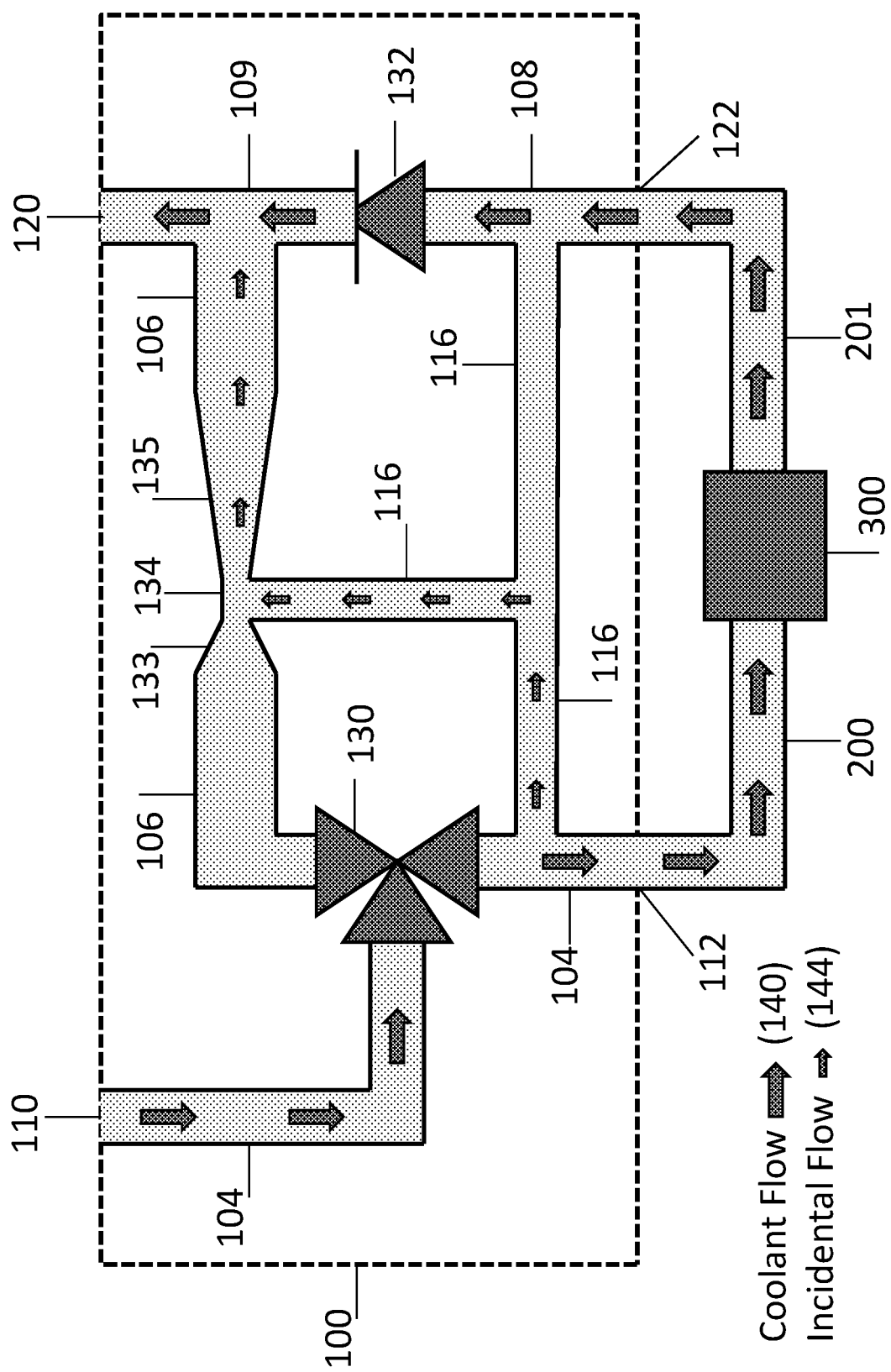
FIG. 7 is a schematic of an apparatus with an incidental flow of liquid coolant through a suction passageway when the liquid coolant also flows to a cooled device, according to one or more embodiments.
Figure 8:
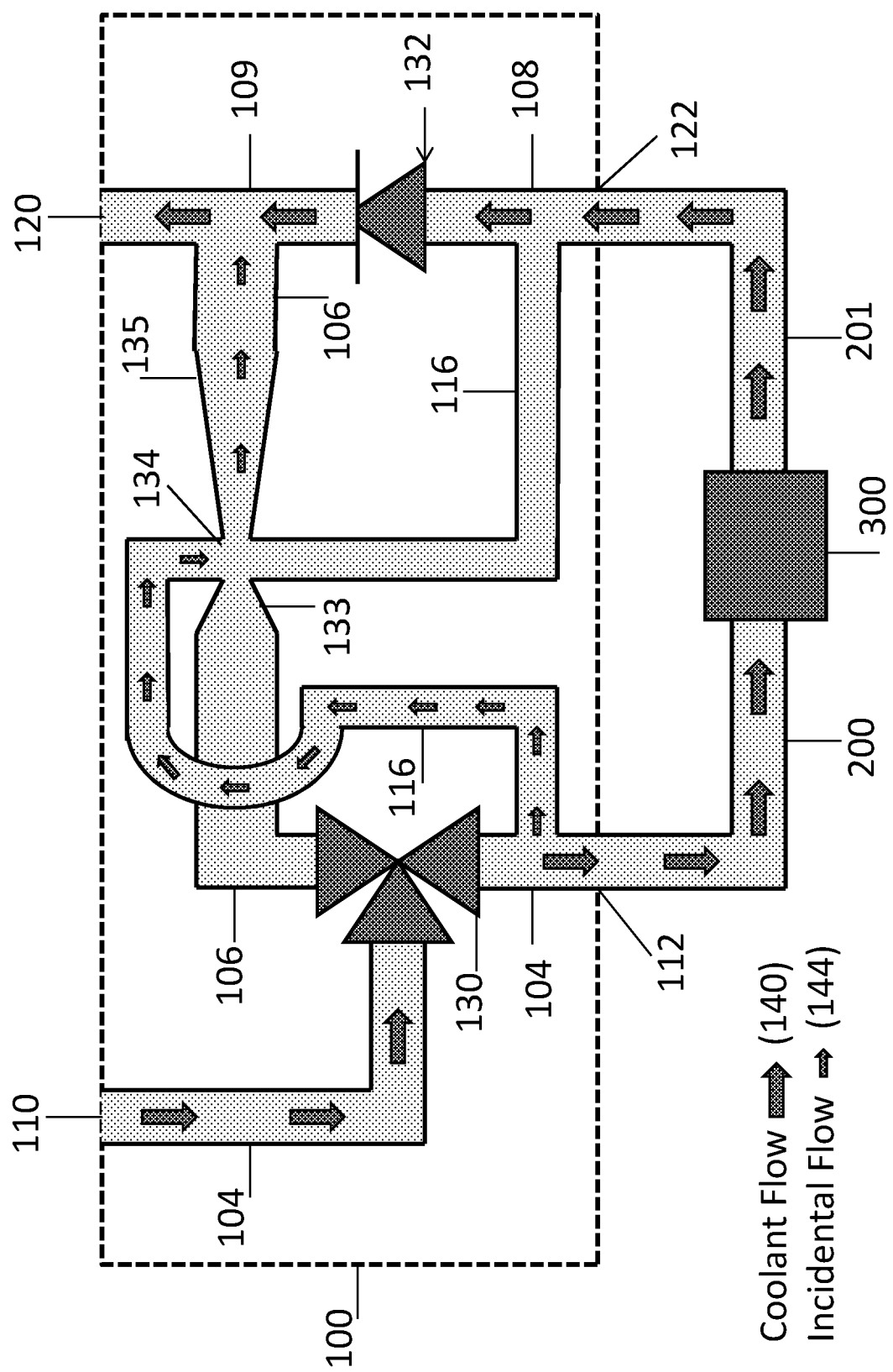
FIG. 8 is a schematic of an apparatus with an incidental flow of liquid coolant through two individual suction passageways when the liquid coolant also flows to a cooled device, according to one or more embodiments.
Figure 9:
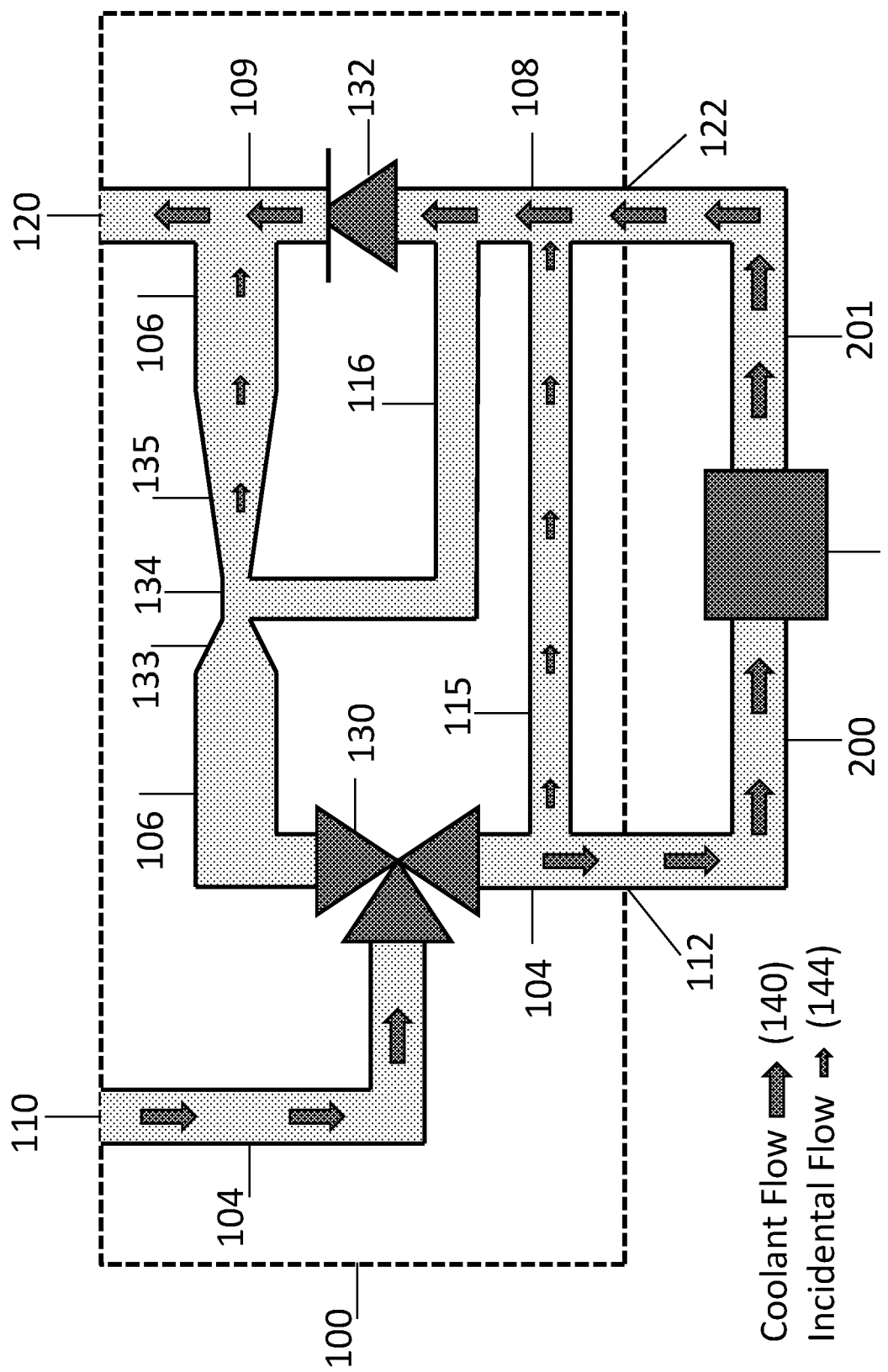
FIG. 9 is a schematic of an apparatus with an incidental flow of liquid coolant through a parallel passageway when the liquid coolant also flows to a cooled device, according to one or more embodiments.

As illustrated in FIG. 7, when the three-way valve 130 shuts off the liquid coolant flow 140 to the bypass passageway 106, and directs the liquid coolant flow 140 to the cooled device 300, an incidental flow 144 of the liquid coolant may pass through the suction passageway 116, and onward through the bypass passageway 106 to be added to the coolant flow through the exhaust passageway 109, and discharged from the apparatus 100 through the exhaust outlet 120. FIGS. 8 and 9 illustrate how the incidental flow 144 may occur for the separate connection of the suction passageway 116 to the supply passageway 104, and for the parallel passageway 115, respectively.

Figure 10:
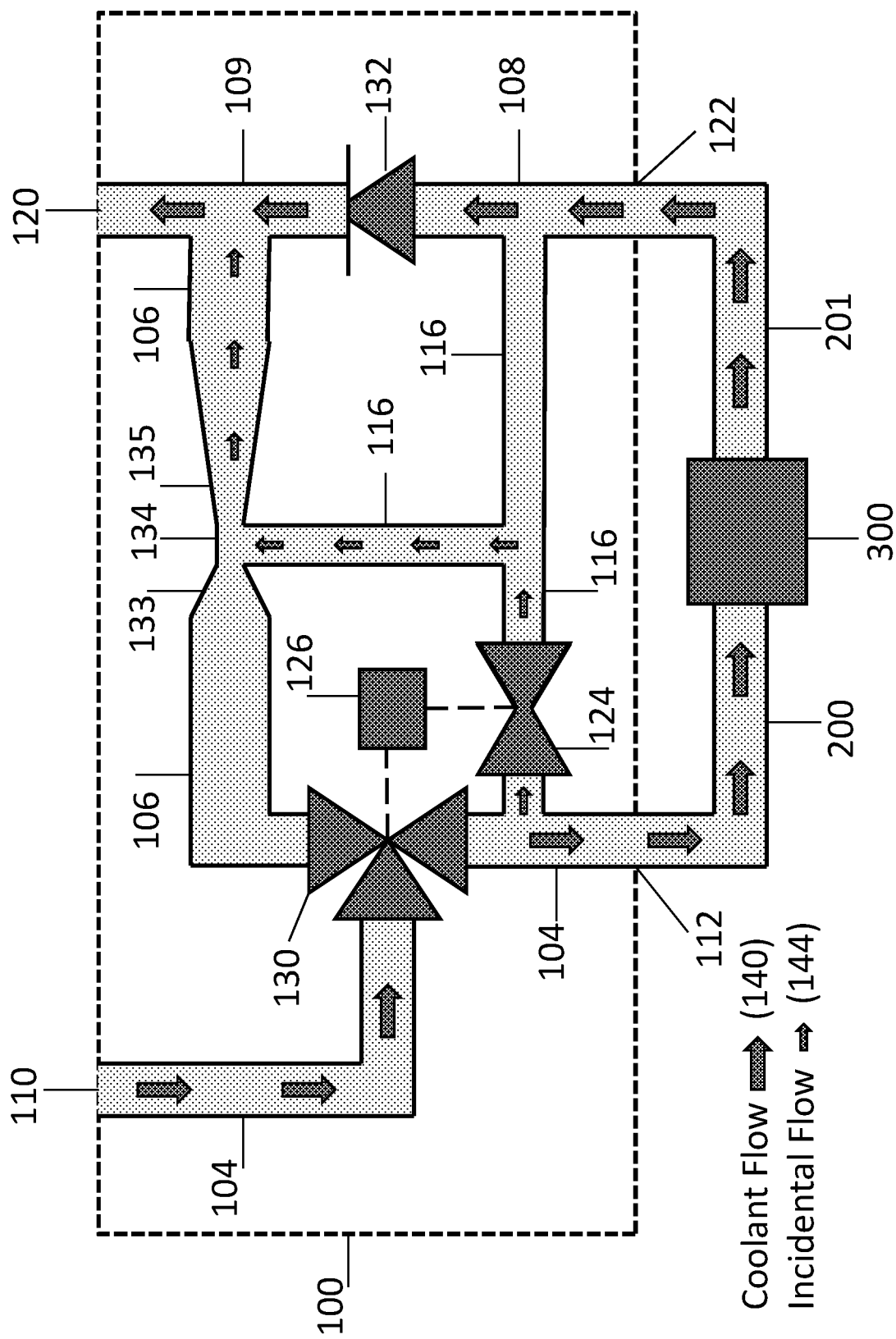
FIG. 10 is a schematic of an apparatus with a shutoff valve disposed in the suction passageway to stop or substantially reduce incidental flow of liquid coolant from a supply passageway through the suction passageway, according to one or more embodiments.
Figure 11:
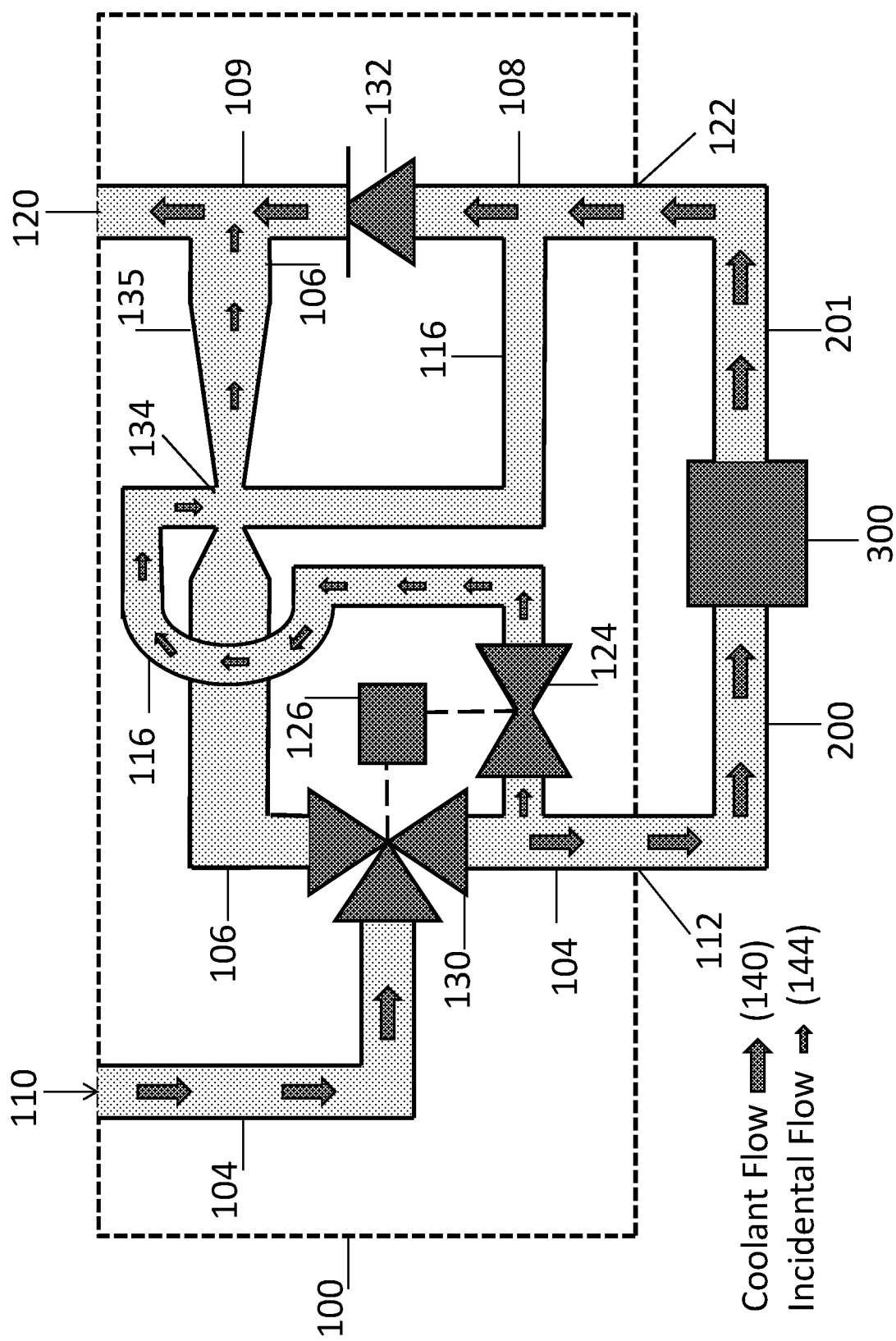
FIG. 11 is a schematic of an apparatus with a shutoff valve disposed in a suction passageway coupled to a supply passageway in order to stop or substantially reduce an incidental flow of liquid coolant through the suction passageway, according to one or more embodiments.
Figure 12:
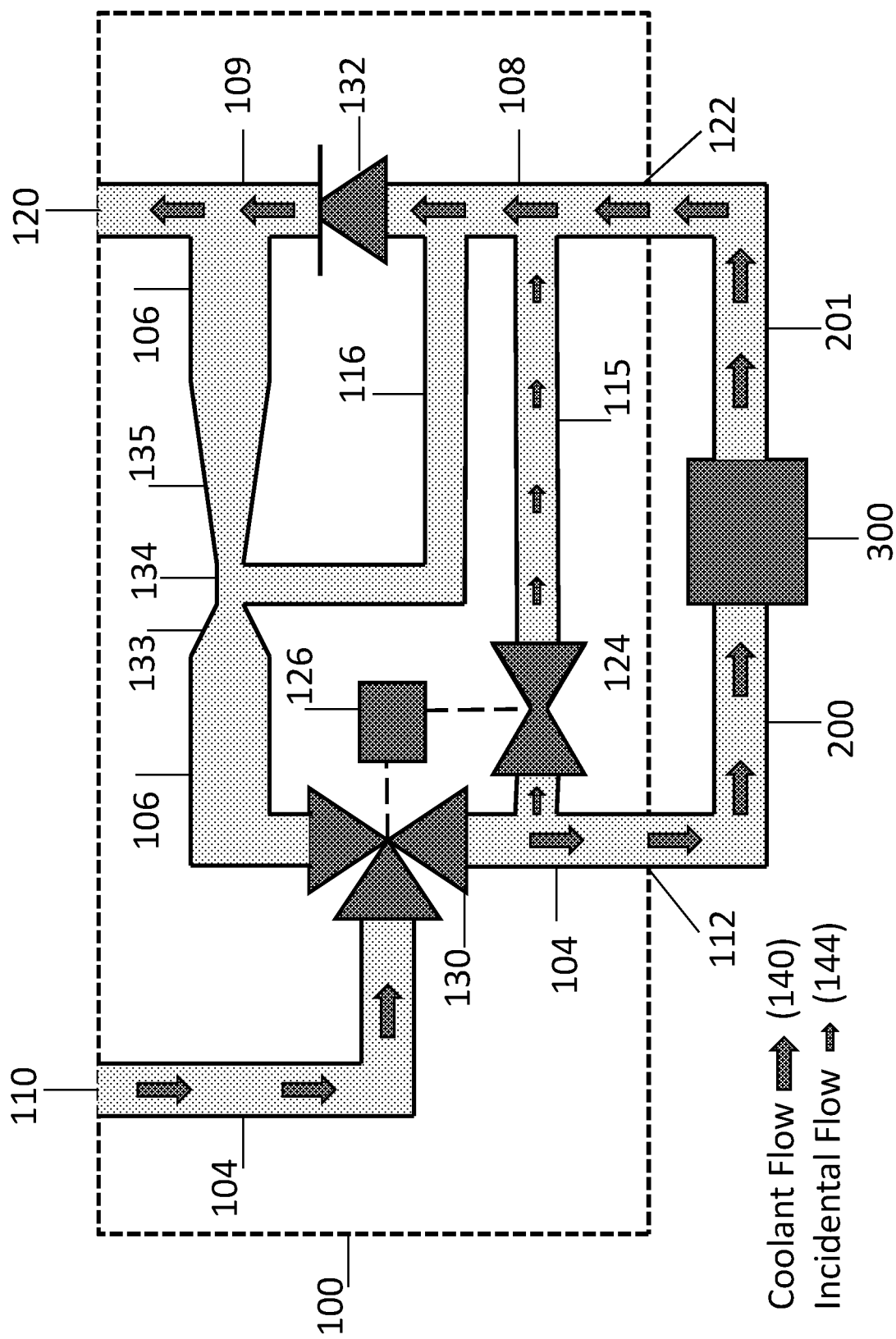
FIG. 12 is a schematic of an apparatus with a shutoff valve disposed in a parallel suction passageway to stop or reduce incidental flow of liquid coolant from a supply passageway to the return passageway, according to one or more embodiments.

If the incidental flow 144 of the liquid coolant from the supply passageway 104 to the exhaust outlet 120 is undesired for a certain application, a shutoff valve 124, as shown in FIG. 10, may be disposed in the suction passageway 116. When the three-way valve 130 shuts off the coolant flow 140 to the bypass passageway 106, the shutoff valve 124 may correspondingly stop or significantly reduce the incidental flow 144 of the liquid coolant through the suction passageway 116. FIGS. 11 and 12 illustrate how the shutoff valve 124 may be disposed for the separate connection of the suction passageway 116 to the supply passageway 104, and for the parallel passageway 115, respectively. In any case, a single actuator 126 may be used to actuate both the three-way valve 130 and the shutoff valve 124. The means of actuation for either or both valves could be i) linear movement (e.g., a linear pneumatic, hydraulic, solenoid electrical actuator, etc.) or circular, rotational movement (e.g., a digital or analog motor drive, etc.). The means include manual operation, automated microcontroller operation of a mechanical or electrical motive force, or re-purposed robotic motion.

The routine detachment of the cooled device is required in certain applications. In some of these applications, for example when the cooled device is a resistance-welding electrode, the volume of liquid coolant contained within the cooled device is small, and the potential leakage of the residual liquid coolant from the cooled device, once removed from the coolant lines, may be of little concern. But in other applications, such as a liquid-cooled computing server or other electronic device, or a wafer platen in a semiconductor processing apparatus, the volume of liquid coolant contained within the cooled device may be large enough that the potential leakage of the residual liquid coolant from the cooled device, when removed from the coolant line, may be of some consequence.

Figure 13:
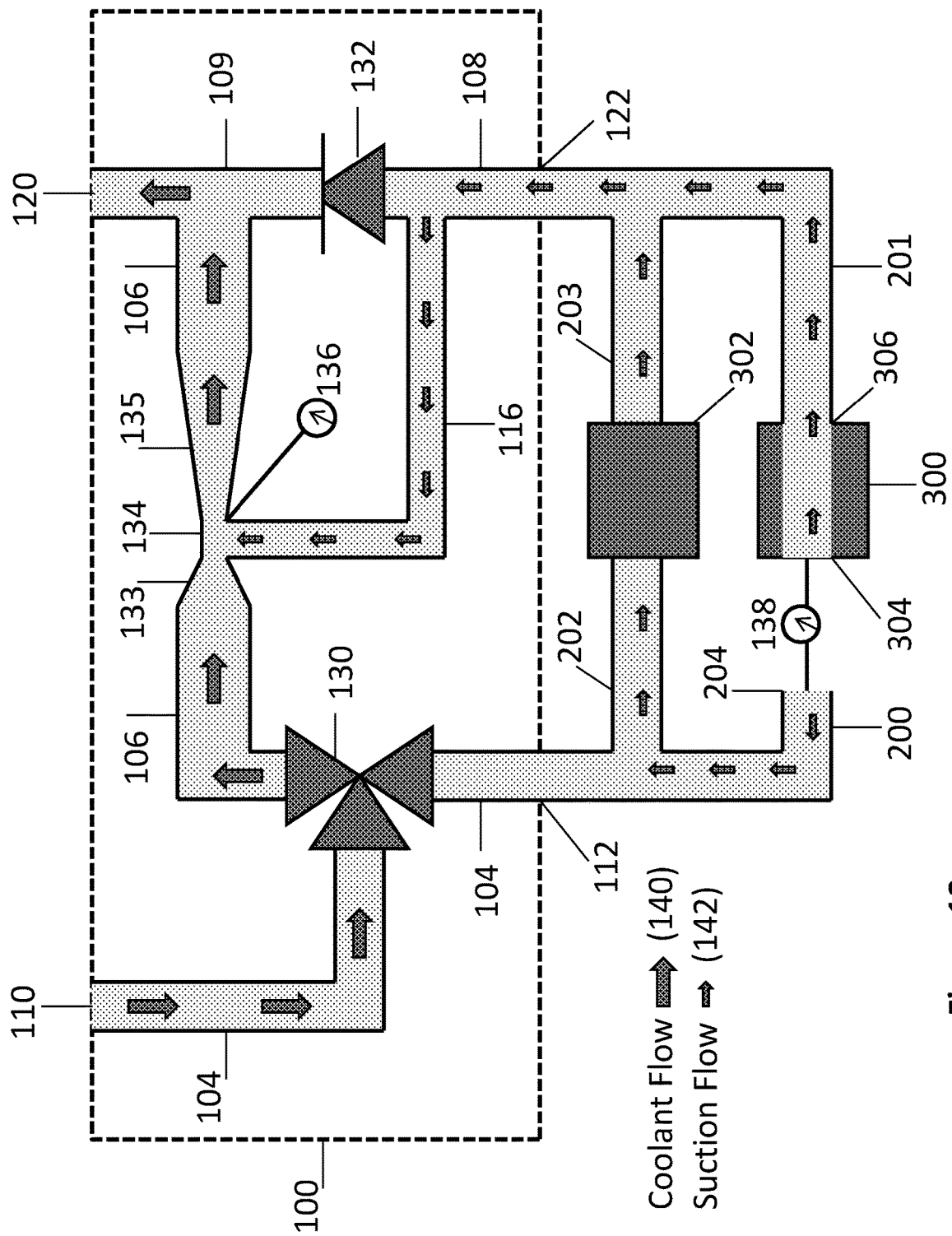
FIG. 13 is a schematic of an apparatus with a device inlet of the first cooled device detached from a first supply line, with the resulting suction flow path evacuating at least a portion of the liquid coolant from the first cooled device, according to one or more embodiments.

As shown in FIG. 13, in order to limit the amount of the residual liquid coolant that may be lost from the first cooled device 300, when detached from the first supply line 200 and the first return line 201, the first supply line 200 may be detached from a first connection 304 of the first cooled device 300 before the first return line 201 is detached from a second connection 306, and a certain period of time allowed for the suction flow 142 to evacuate a portion of the liquid coolant from the first cooled device 300 before the first return line 200 is detached from the second connection 306. Conversely, the first return line 201 may be detached from the second connection 306 before the first supply line 200 is detached from the first connection 304.

Figure 14:
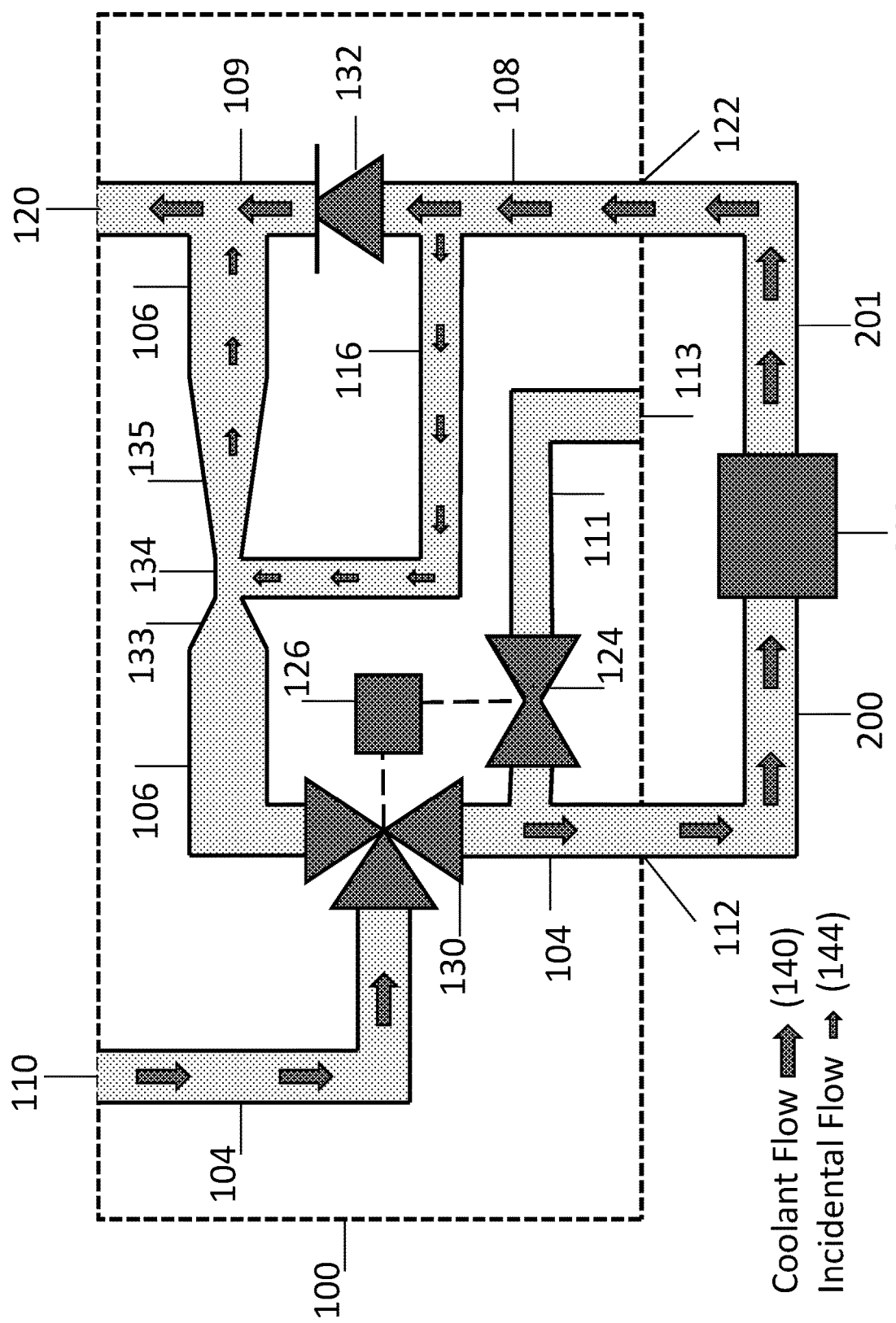
FIG. 14 is a schematic of an apparatus delivering liquid coolant flow to a first cooled device, with a shutoff valve preventing the liquid coolant flow from escaping the apparatus through a vent passageway, according to one or more embodiments.
Figure 15:
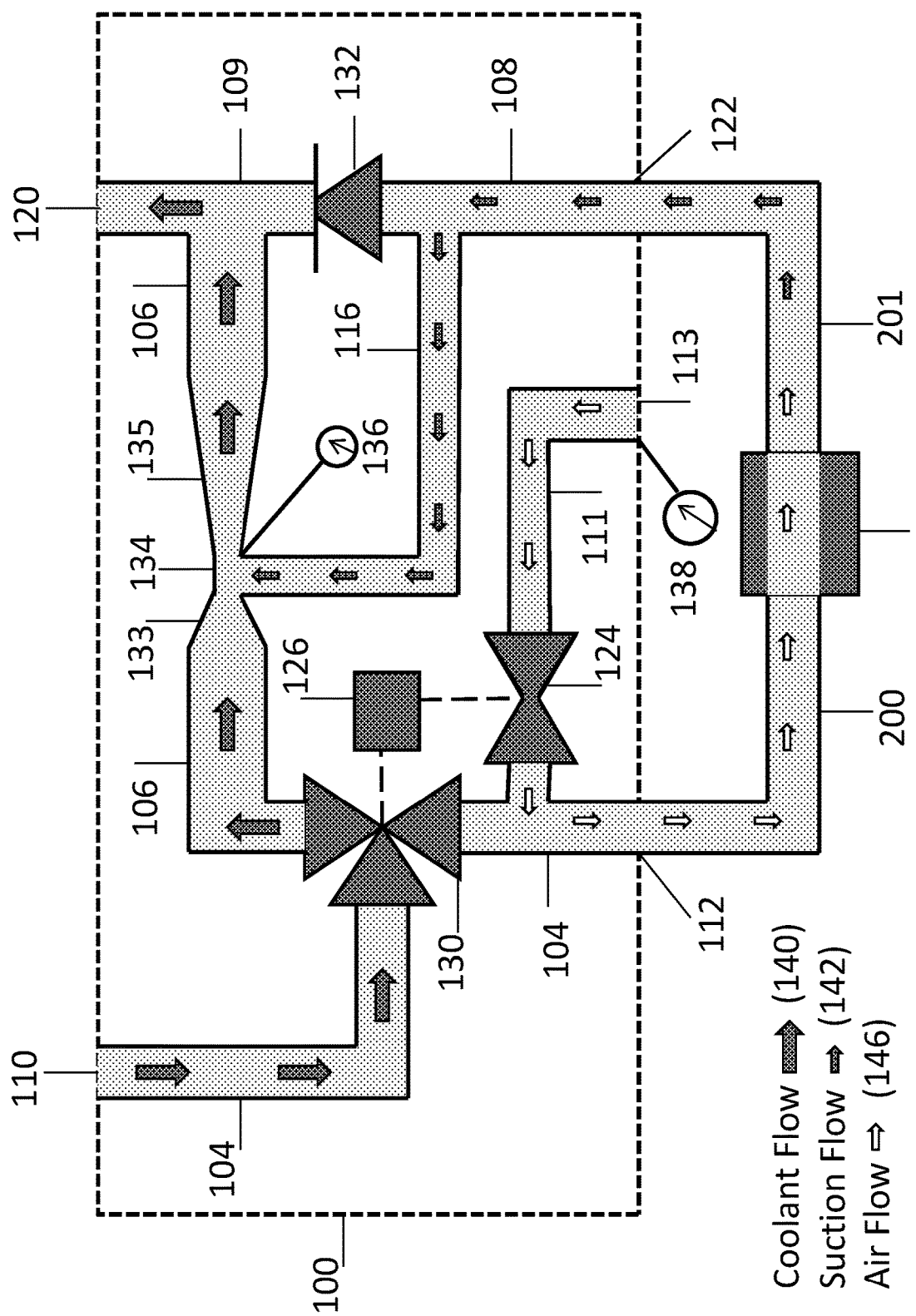
FIG. 15 is a schematic of an apparatus with a shutoff valve open for a suction flow path vented by a vent passageway to atmospheric pressure, for cooling multiple devices coupled in parallel, according to one or more embodiments.

FIGS. 14 and 15 illustrate an alternative method for the apparatus 100 to remove a portion of the liquid coolant from the first cooled device 300 before detachment from the first supply line 200 and the first return line 201, wherein the apparatus 100 may include a vent passageway 111 to provide a fluid communication between the supply passageway 104 and the atmospheric pressure 138 at a vent inlet 113. FIG. 14 illustrates the shutoff valve 124 disposed in the vent passageway 111, with the shutoff valve 124 stopping the coolant flow 140 from escaping through the vent inlet 113 as the liquid coolant is being delivered to the cooled device 300. FIG. 15 illustrates the shutoff valve 124 disposed in the vent passageway 111, with the shutoff valve 124 open to allow an air flow 146 from the vent inlet 113 to displace the liquid coolant as the suction flow 142 removes a portion of the liquid coolant from the first supply line 200 and the first cooled device 300. After an initiation of the suction flow 142, a certain period may be allowed for a portion of the liquid coolant to be evacuated from the first supply line 200 and the first cooled device 300, before the detachment of the first cooled device 300 from the first supply line 200 and the first return line 201.

When disposed in the vent passageway 111, the shutoff valve 124 may be actuated by the same valve actuator 126 as the three-way valve 130. However, in the case of the shutoff valve 124 in the vent passageway 111, care should be exercised in sequencing the actuation of the shutoff valve 124 and the three-way valve 130 to ensure a sufficient period of time for the coolant flow through the fluid restriction 134 to generate a low-pressure zone 136 lower than the atmospheric pressure 138 in order to relieve a fluid pressure of the liquid coolant in the supply channel 104 higher than the atmospheric pressure 138 before opening the shutoff valve 124. Conversely, the shutoff valve 124 should be closed before the three-way valve 130 is actuated to direct the flow of the liquid coolant to the first cooled device 300. These sequencing measures can prevent the liquid coolant from escaping the apparatus 100 through the vent inlet 113, as may occur if the shutoff valve 124 and the three-way valve 130 are actuated simultaneously.

Figure 16:
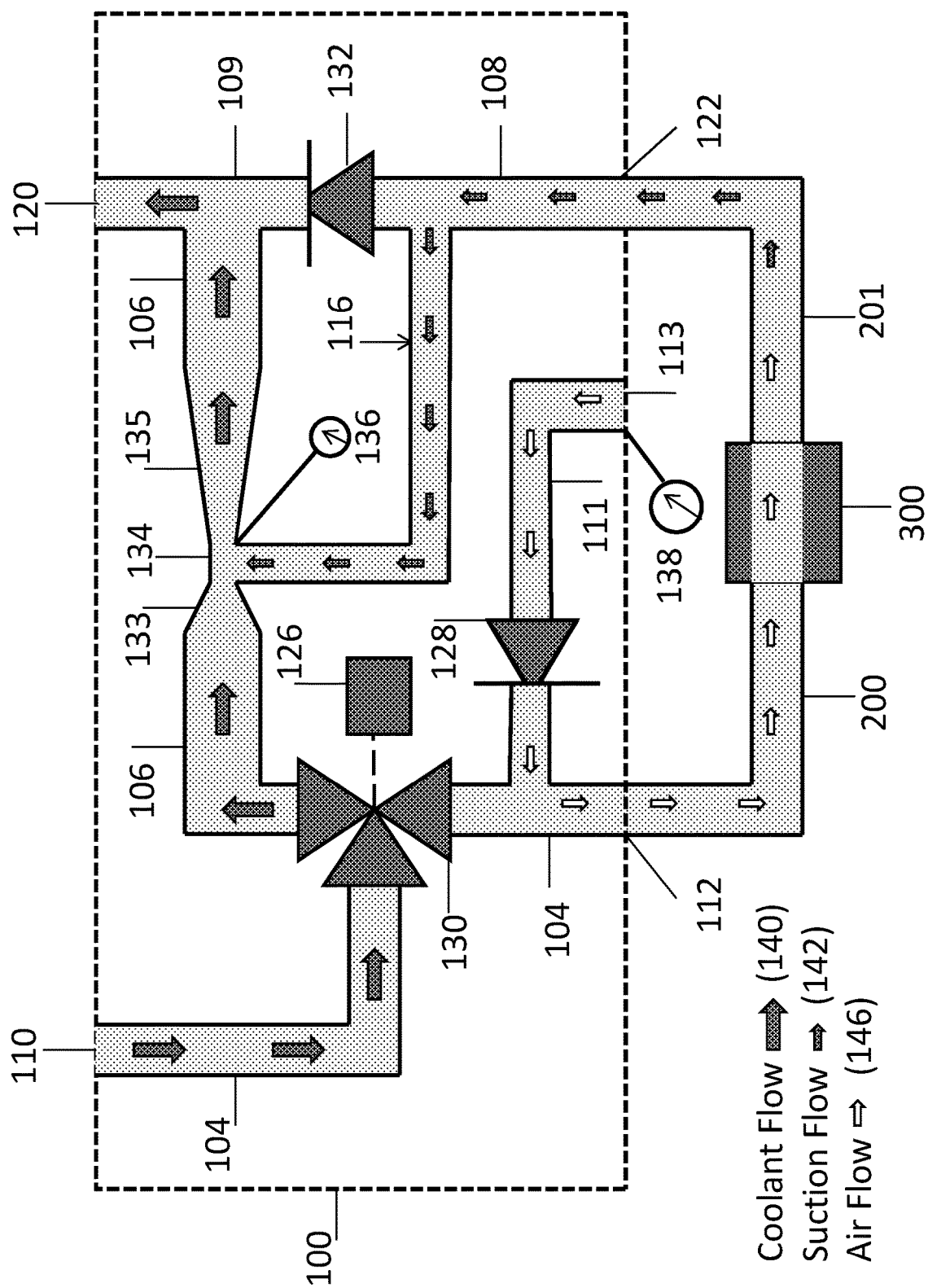
FIG. 16 is a schematic of an apparatus using a vent check valve in a vent passageway that allows airflow to displace a portion of the liquid coolant from a supply line and a cooled device, according to one or more embodiments.

To eliminate the need for valve sequencing, and thus simplify the apparatus 100, a vent check valve 128 may be disposed in the vent passageway 111, as shown in FIG. 16, to allow the air flow 146 from the vent inlet 113 to displace the liquid coolant as the suction flow 142 removes a portion of the liquid coolant from the first supply line 200 and the first cooled device 300, while also stopping the coolant from escaping through the vent inlet 113. Again, a certain period may be allowed after initiating the suction flow 142 to ensure the evacuation of a portion of the liquid coolant from the cooled device 300 before its detachment from the first supply line 200 and the first return line 201.

Figure 17:
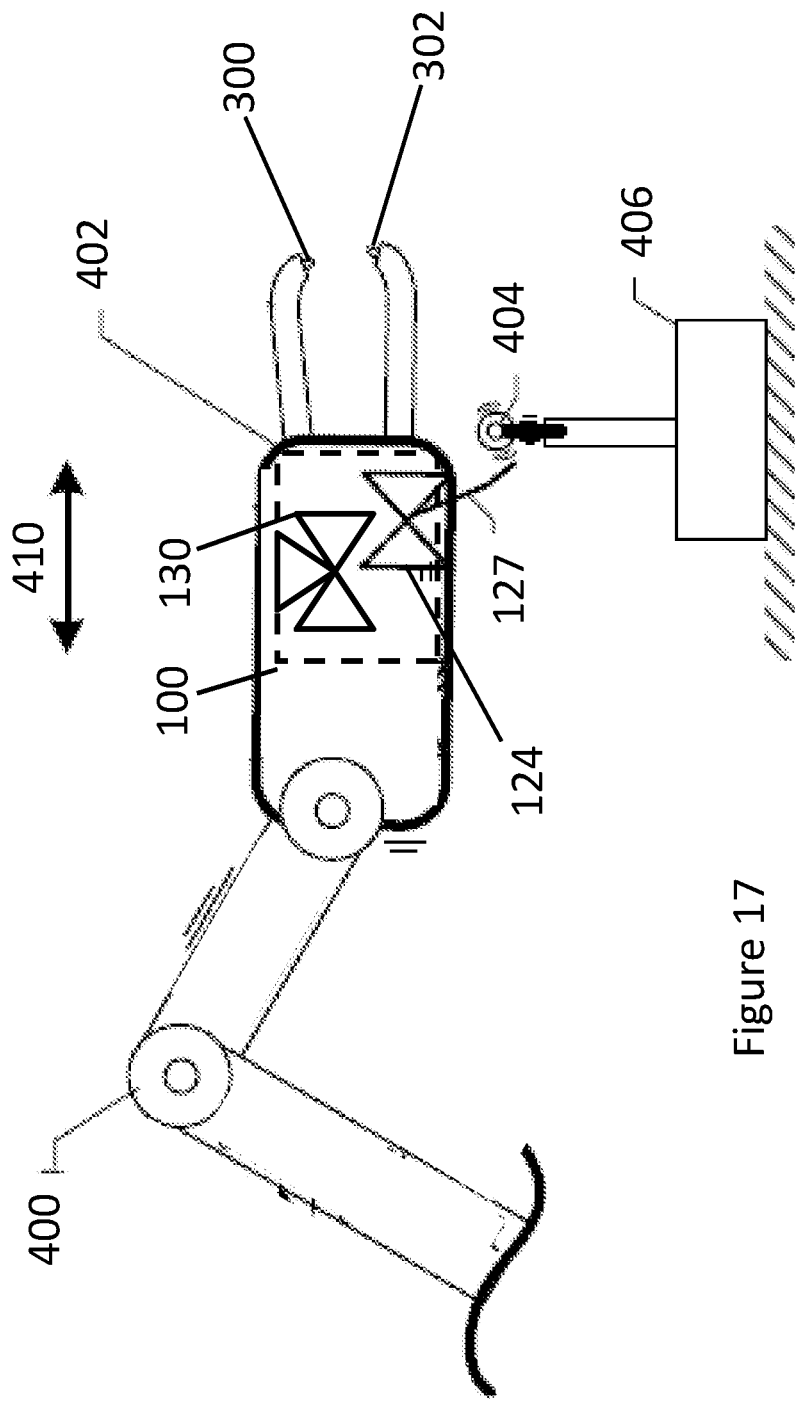
FIG. 17 is an illustration of a robot arm with a flow control apparatus mounted on a welding apparatus coupled to the robot arm, with a three-way valve being actuated by the motion of the robot arm, according to one or more embodiments.

As shown in FIG. 17, the first cooled device 300 and the second cooled device may comprise the resistance welding electrodes of a welding apparatus 402 disposed on a robot arm 400. A robotic motion 410 of the welding apparatus 402 may cause an actuator handle 127, to actuate the three-way valve 130, or the combination of both the three-way valve and the shutoff valve 124, by an engagement of the actuator handle 127 with a handle stop 404, which may be mounted on a pedestal 406, or otherwise in proximity to the robot. This reduction and simplification in the amount of equipment and infrastructure needed to accomplish the actuation of valves may mean that no additional power source is required for the apparatus 100 to evacuate liquid coolant from the electrodes, making it extremely simple and low cost, as well as small and lightweight for practical mounting on the robot arm 400.

Figure 18A:
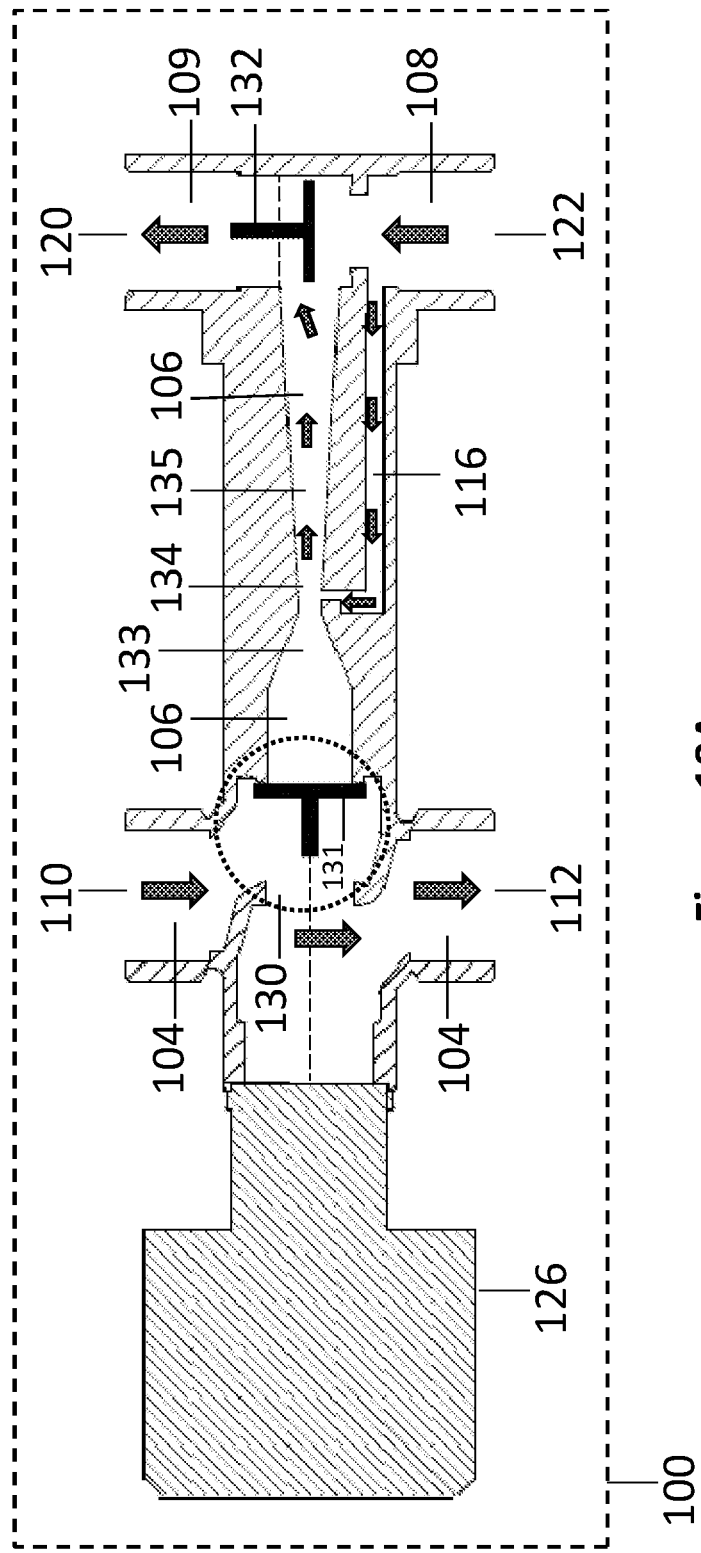
FIG. 18A is a cross-sectional view of an apparatus configured for external flow of coolant directed to an external fluid circuit with a cooled device (not shown), according to one or more embodiments.
Figure 18B:
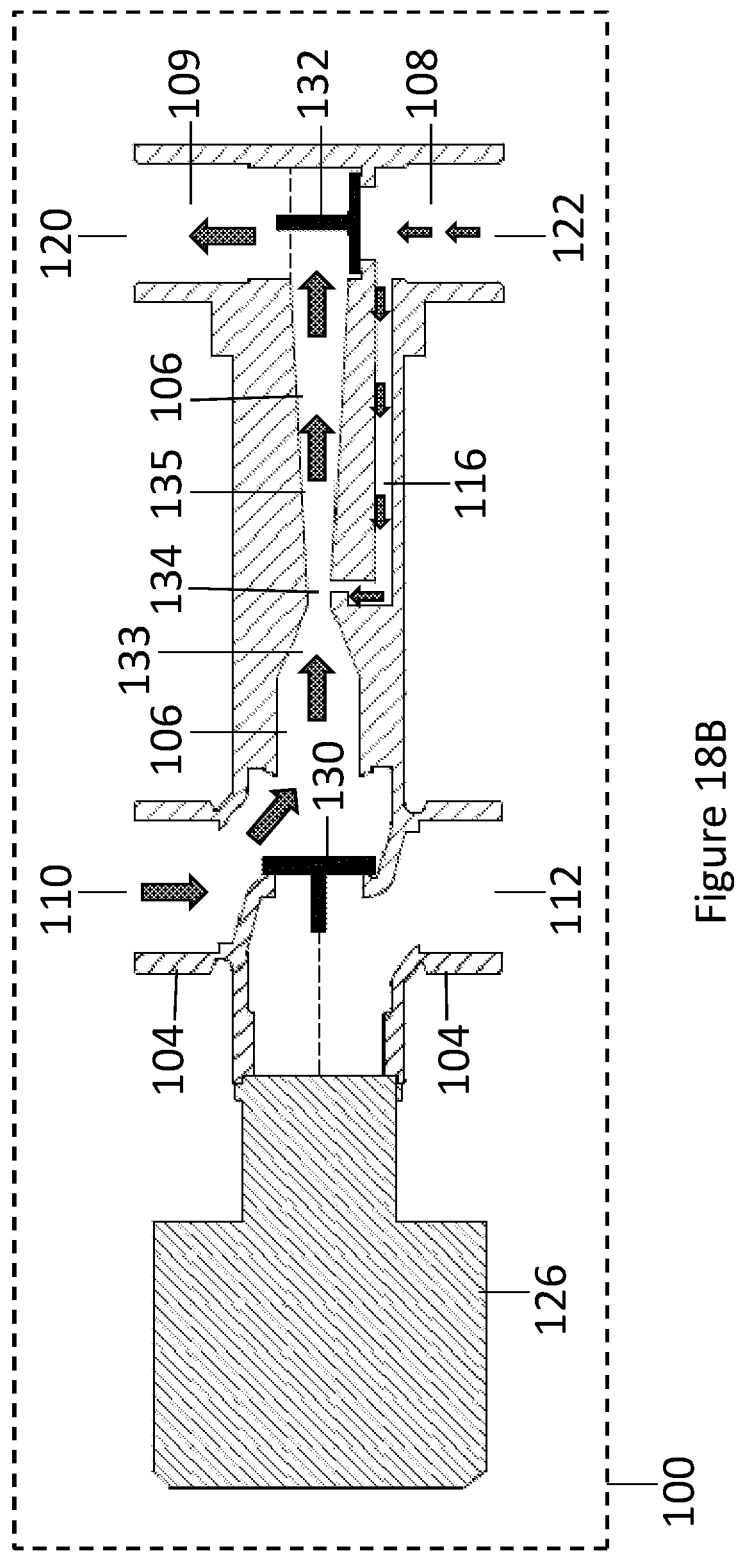
FIG. 18B is a cross-sectional view of an apparatus configured for bypass flow of coolant directed through a bypass passageway, according to one or more embodiments.

FIGS. 18A and 18B show a cross-sectional view of one possible embodiment of the apparatus 100. In FIG. 18A, the valve actuator 126 holds a valve diaphragm 131 in a position where the three-way valve 130 directs the coolant flow 140 from the source inlet 110 to the supply outlet 112. After exiting the supply outlet 120 the coolant flow 140 is channeled through a cooled device not shown and returned to the return inlet 122, where the coolant flow 140 passes through the return check valve 132 and exits the apparatus 100 from the exhaust outlet 120. Other features of the apparatus 100 correspond to the features of FIG. 1, as described in paragraph 100.

In FIG. 18B, the valve actuator 126 holds the valve diaphragm 131 in a position where the three-way valve 130 directs the coolant flow 140 through the bypass passageway 106. Other features of the apparatus 100 correspond to the features of FIG. 2A, as described in paragraphs 110 and 120.

Figure 19A:
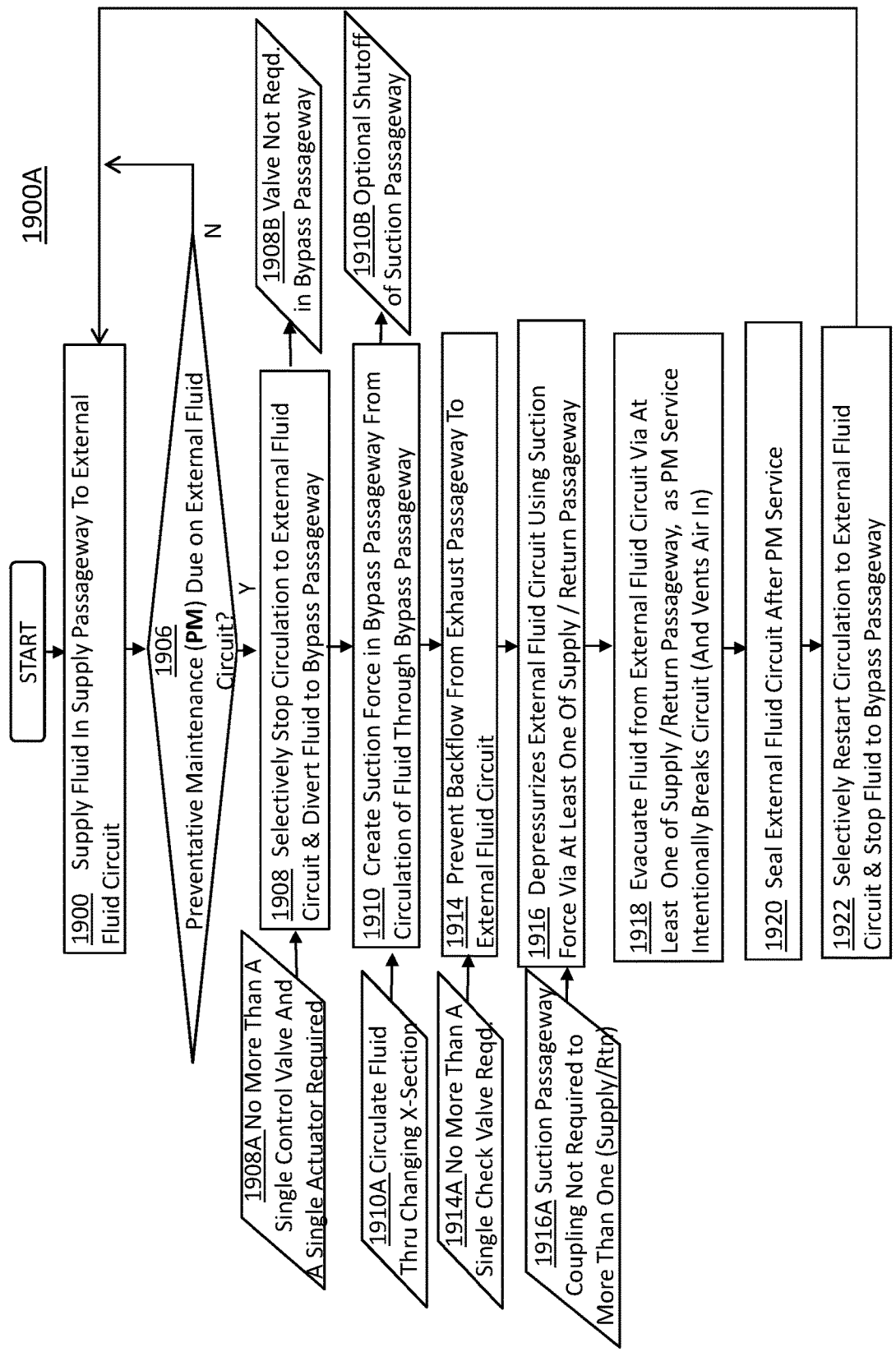
FIG. 19A is a flowchart of a method for controlling a circulation of a fluid to, and an evacuation of the fluid from, an external fluid circuit undergoing preventative maintenance, according to one or more embodiments.
Figure 19B:
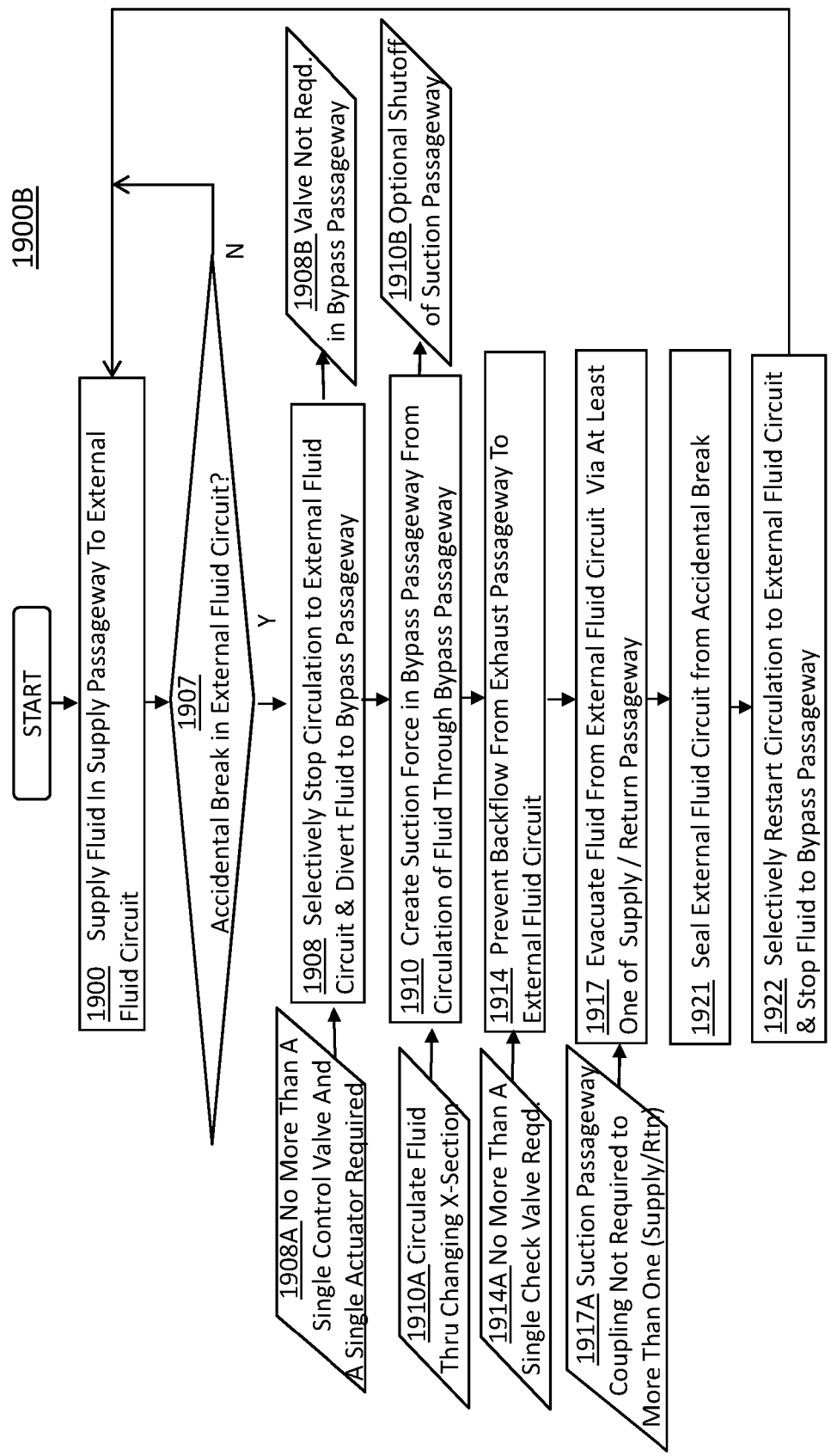
FIG. 19B is a flowchart of a method for controlling a circulation of a fluid to, and an evacuation of the fluid from, an external fluid circuit experiencing an accidental break, according to one or more embodiments.

FIGS. 19A and 19B are flowcharts of methods to control circulation of a fluid to, and an evacuation of the fluid from, an external fluid circuit. Specifically, FIG. 19A is a flowchart 1900A of a method for controlling a circulation of a fluid to, and an evacuation of the fluid from, an external fluid circuit undergoing preventative maintenance, according to one or more embodiments.

Operation 1900 supplies fluid in supply passageway 104 to external fluid circuit 101, e.g., as shown in FIG. 1, as external flow mode. Inquiry 1906 asks if preventative maintenance (PM) is due on external fluid circuit 101. If 'no', then the fluid supply operation 1900 continues unchanged per external flow mode, e.g., as shown in FIGS. 1, 7-12, 14, and 18A. If 'yes', then operation 1908 selectively stops circulation of fluid to the external fluid circuit 101 (manually or via an automated actuator) and simultaneously diverts fluid to bypass passageway 106, in a bypass mode (aka, diverted or evacuation mode), e.g., as shown in FIGS. 2A-2C, 3-6, 13, 15-16, and 18B. By simultaneously performing both operations with no more than a single control valve and no more than a single actuator being required, per input 1908A, the present embodiment eliminates a possibility of malfunction or mistiming of two separate valves located apart from each other and/or in different branches of apparatus 100. Per 1908B, it is noted that a valve is not required in bypass passageway 106 with the present embodiment, thus reducing cost, complexity, timing glitches, maintenance, failure events, etc.

Operation 1910 automatically creates suction force in bypass passageway 106 from circulation of fluid 140 through bypass passageway 106. Input 1910A notes the circulated fluid flow through changing cross section areas 133 and 135, while output 1910B notes an optional shutoff 124 of suction passageways 106, e.g., FIGS. 11-12. Operation 1914 simultaneously prevents backflow from exhaust passageway 109 to external fluid circuit 101. Input 1914A enables this with no more than a single check valve required, e.g., return check valve 132 in FIGS. 1-16, and 18B.

Operation 1916 depressurizes external fluid circuit 101 for the PM operation, presumably pressurized if there is no leak or break in the line. This operation occurs almost simultaneously in the bypass mode, since suction pressure arises and communicates quickly via incompressible fluid. Neither additional valve equipment nor separate operation is required for this step. Depressurizing external fluid circuit 101 prevents a burst or squirt of fluid occurring in an otherwise pressurized system that is disconnected. This is significant for applications with high-pressure fluid, or toxic fluid, or chilled/heated fluid. Input 1916A beneficially notes a suction passageway coupling is not required to more than one of a supply passageway 104 or return passageway 108, e.g., as shown in FIGS. 1, 2A-2C, 9, 13-16, and 18A-18B with a single suction passageway 116, typically to return passageway 108. A suction passageway 116 coupling to only a supply passageway 104 is also feasible, though not illustrated herein.

Operation 1918 evacuates fluid from external fluid circuit 101 via at least one of supply passageway 104 or return passageway 108 at the point the PM Service intentionally breaks a line and allows air to vents the evacuation of fluid therefrom. Operation 1920 presumes that after any PM work or repair/replacement was completed, external fluid circuit 101 is hermetically sealed and ready to reenter operation. Operation 1922 selectively restarts coolant flow 140 circulation to external fluid circuit 101 (external flow mode) and stops coolant flow 140 to bypass passageway 106, by the manual or actuator movement of control valve 130 to an appropriate position, which returns the flowchart operation 1900A back to operation 1900 start. Overall, the operation of flowchart 1900B, e.g., for apparatus 100, is streamlined, robust, safe, fast, error-proof, lean, and effective.

FIG. 19B is a flowchart 1900B of a method for controlling a circulation of a fluid to, and an evacuation of the fluid from, an external fluid circuit experiencing an accidental break, according to one or more embodiments. Most of the operations in flowchart 1900B are identical to those in flowchart 1900A, though flowchart 1900B is for an 'accidental break' in external fluid circuit that is then automatically depressurized, while flowchart 1900A is for a sealed external fluid circuit before the PM action breaks the line. Thus, only unique operations of flowchart 1900B (1907, 1917, and 1921) are discussed here, with the remainder of descriptions for same-numbered operations being incorporated by reference from flowchart 1900A into the present flowchart.

Operation 1907 asks if an accidental break (or leak) arose on external fluid circuit 101. If 'no', then the fluid supply operation 1900 continues unchanged per external flow mode, e.g., as shown in FIGS. 1, 7-12, 14, and 18A. If 'yes', then operation 1908 selectively stops circulation of fluid to the external fluid circuit 101 (manually or via an automated actuator) and simultaneously diverts fluid to bypass passageway 106, in a bypass mode (aka, diverted or evacuation mode), e.g., as shown in FIGS. 2A-2C, 3-6, 13, 15-16, and 18B. A leak may be a drip or it may be an exigent situation as a ruptured line spraying a heated, toxic, slippery, and/or otherwise undesirable fluid. The latter condition being much more critical than a typical PM condition. Regardless, immediate remedy and mitigation is required. By simultaneously performing both operations with no more than a single control valve and no more than a single actuator being required, per input 1908A, the present embodiment eliminates a possibility of potentially serious bodily harm or equipment damage. The present embodiment does so by eliminating conventional weaknesses that might consume more time, be less robust, and/or have higher probability of misoperation arising from malfunction or mistiming of two separate valves located apart from each other and/or in different branches of apparatus 100.

Operation 1917 evacuates fluid from external fluid circuit 101 via at least one of supply passageway 104 or return passageway 108 at the point the suction force becomes adequate to pull fluid from return passageway 108 and the rest of the external fluid circuit 101. Granted, an accidental break in a fluid line might lead to a substantial amount of leakage in a worst-case scenario before a control valve can be actuated. However, at the point that the accident is apparent, a single simple operation 1908 is the only step required to remedy and mitigate the problem. Operation 1921 of sealing external fluid circuit 101 from the accidental break might require substantially more repairs and time than a PM Service, but the result of returning the system to operation is the same.

Overall flowchart 1900B provides a fastest and most robust solution to an accidental break in an external fluid circuit. While not described, the present flowchart contemplates an automatic detection of a leakage incident. This could provide a faster shutdown and evacuation operation.

Alternatives:

The above advantages are exemplary, and these or other advantages may be achieved by the invention. Further, the skilled person will appreciate that not all advantages stated above are necessarily achieved by embodiments described herein.

In the foregoing specification, the invention has been described with reference to specific examples of embodiments of the invention. It will be evident, however, that various modifications and changes may be made therein without departing from the broader spirit and scope of the invention as set forth in the appended claims.

Methods and operations described herein can be in different sequences than the exemplary ones described herein, e.g., in a different order. Thus, one or more additional new operations may be inserted within the existing operations or one or more operations may be abbreviated or eliminated, according to a given application.

The foregoing descriptions of specific embodiments of the present disclosure have been presented for purposes of illustration and description. They are not intended to be exhaustive or to limit the invention to the precise forms disclosed. Many modifications and variations are possible in light of the above teaching without departing from the broader spirit and scope of the various embodiments. The embodiments were chosen and described in order to explain the principles of the invention and its practical application best and thereby to enable others skilled in the art to best utilize the invention and various embodiments with various modifications as are suited to the particular use contemplated. It should be appreciated that embodiments, as described herein, can be utilized or implemented alone or in combination with one another. While the present invention has been described in particular embodiments, it should be appreciated that the present invention should not be construed as limited by such embodiments, but rather construed according to the claims appended hereto and their equivalents. The present invention is defined by the features of the appended claims.

I claim:

1. An apparatus for controlling a circulation of a liquid in an external fluid circuit for a normal operation and for evacuating the liquid from, the external fluid circuit for a maintenance operation, the apparatus comprising;
   a supply passageway for supplying the liquid to the external fluid circuit;
   a control valve disposed in the supply passageway for selectively stopping the circulation of the liquid to the external fluid circuit, and for selectively diverting the liquid to a bypass passageway, whereby a circulation of the liquid through the bypass passageway creates a suction force in the bypass passageway;
   a return passageway for returning the liquid from the external fluid circuit;
   a return check valve disposed in the return passageway for preventing a backflow of the liquid through the return passageway; and
   a suction passageway coupling the bypass passageway to at least one of the return passageway or the supply passageway, for evacuating at least a portion of the liquid from the external fluid circuit.

2. The apparatus of claim 1, wherein:
at least one section of the bypass passageway has a gradually changing cross-sectional area coupled to at least one fluid restriction; and
the suction passageway is connected to the fluid restriction.

3. The apparatus of claim 1 wherein:
no other valve is disposed in the supply passageway, the external fluid circuit, or the bypass passageway apart from the control valve.

4. The apparatus of claim 1 wherein:
the control valve is a multi-way valve with a first position for delivering the liquid from the supply passageway to the external fluid circuit, and a second position for diverting the liquid from the supply passageway to the bypass passageway.

5. The apparatus of claim 1 wherein:
no more than a single actuator is required to operate the apparatus.

6. The apparatus of claim 1 wherein:
no more than a single suction passageway is required to be coupled to the at least one of the supply passageway or the return passageway.

7. The apparatus of claim 1 further comprising:
a suction check valve disposed in the suction passageway to prevent a backflow of the fluid from the bypass passageway to the external fluid circuit.

8. The apparatus of claim 1, further comprising:
a suction shutoff valve disposed in the suction passageway to prevent an incidental flow of the fluid from the supply passageway to the bypass passageway when the fluid is not diverted to the bypass passageway by the control valve.

9. The apparatus of claim 8 wherein:
no more than a single actuator is required to operate the control valve and the suction shutoff valve.

10. The apparatus of claim 1, further comprising:
a vent passageway, coupling the supply passageway to atmospheric pressure; and
a vent check valve disposed in the vent passageway.

11. An apparatus for controlling a circulation of a liquid in an external fluid circuit for a normal operation and for evacuating the liquid from, the external fluid circuit for a maintenance operation, the apparatus comprising;
a primary fluid circuit comprising a supply passageway and a return passageway;
a bypass passageway coupling the supply passageway to the return passageway, wherein the bypass passageway creates a suction force for evacuating at least a portion of the liquid from the external fluid circuit;
a return check valve disposed in the return passageway for preventing a backflow of the liquid through the return passageway;
at least one suction passageway coupling at least one of the supply passageway or the return passageway to the bypass passageway for evacuating the at least a portion of the liquid; and
no more than a single control valve and a single check valve are required for the apparatus to control the circulation of the liquid to, and an evacuation of the liquid from, the external fluid circuit.

12. The apparatus of claim 11 wherein;
no valves of any type are required in the bypass passageway or in the external fluid circuit.

13. A system for controlling a circulation of a liquid in an external fluid circuit for a normal operation and for evacuating the liquid from, the external fluid circuit for a maintenance operation, the system comprising;
a device utilizing a liquid flow, wherein the device comprises at least one of: a resistance welding machine, a semiconductor device, an electronic circuit, or a semiconductor fabrication equipment; and
an apparatus, coupled to the device, for controlling the circulation of a liquid in the external fluid circuit for the normal operation and for evacuating the liquid from, the external fluid circuit for a maintenance operation, the apparatus comprising;
a supply passageway for supplying the liquid to the external fluid circuit;
a control valve disposed in the supply passageway for selectively stopping the circulation of the liquid to the external fluid circuit, and for diverting the liquid to a bypass passageway, whereby a circulation of the liquid through the bypass passageway creates a suction force in the bypass passageway;
a return passageway for returning the liquid from the external fluid circuit;
a return check valve disposed in the return passageway for preventing a backflow of the liquid through the return passageway;
a suction passageway coupling the bypass passageway that creates the suction force to either the return passageway or the supply passageway, for evacuating at least a portion of the liquid from the external fluid circuit.

14. A method of controlling a circulation of a liquid in an external fluid circuit for a normal operation and for evacuating the liquid from, the external fluid circuit for a maintenance operation, the method comprising:
supplying the liquid in a supply passageway to the external fluid circuit;
selectively stopping the circulation of the liquid to the external fluid circuit with no more than one control valve that also diverts the liquid to a bypass passageway;
creating a suction force in the bypass passageway from the circulation of the liquid through the bypass passageway;
preventing a backflow of the liquid through a return passageway;
evacuating at least a portion of the liquid from at least one of the supply passageway or the return passageway, by using the suction force from the bypass passageway.

15. The method of claim 14 wherein the operation of creating the suction force further comprises:
circulating the liquid through a gradually changing cross-sectional area of the bypass passageway on an upstream side and on a downstream side of a fluid restriction; and
the operation of creating a suction force arises at a point where the suction passageway is connected to the fluid restriction.

16. The method of claim 14 wherein:
shutting off the circulation of liquid within the bypass passageway via a valve disposed in the bypass passageway is not required.

17. The method of claim 14 wherein:
no more than a single operation of selectively stopping the circulation of the liquid to the external fluid circuit and simultaneously diverting the liquid to the bypass passageway is required to operate the apparatus.

18. The method of claim 14 further comprising:
operating at least one actuator to control the circulation of the liquid to, and the evacuation of the liquid from, the external fluid circuit; and wherein:
no more than a single actuator is required.

19. The method of claim 14 further comprising:
coupling the bypass passageway via a single suction passageway to least one of the supply passageway or the return passageway; and wherein:
the operation of coupling is not required to more than one of the supply passageway or the return passageway to effectuate the evacuation of the liquid from the external fluid circuit.

20. The method of claim 14 further comprising:
preventing a backflow of the liquid from the bypass passageway to the external fluid circuit via a suction check valve disposed in the suction passageway.

* * * * *